(12) United States Patent
Den Boef et al.

(10) Patent No.: US 10,508,906 B2
(45) Date of Patent: Dec. 17, 2019

(54) METHOD OF MEASURING A PARAMETER AND APPARATUS

(71) Applicant: ASML Netherlands B.V., Veldhoven (NL)

(72) Inventors: Arie Jeffrey Den Boef, Waalre (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/121,780

(22) Filed: Sep. 5, 2018

(65) Prior Publication Data

US 2019/0086201 A1 Mar. 21, 2019

(30) Foreign Application Priority Data

Sep. 7, 2017 (EP) ..................................... 17189918

(51) Int. Cl.
*G03F 7/20* (2006.01)
*G01B 11/27* (2006.01)

(52) U.S. Cl.
CPC ............ *G01B 11/272* (2013.01); *G03F 7/705* (2013.01); *G03F 7/70633* (2013.01); *G01B 2210/56* (2013.01)

(58) Field of Classification Search
CPC .. G01M 11/0271; G03F 7/70; G03F 7/70483; G03F 7/70591; G03F 7/706; G03F 7/70616; G03F 7/70625; G03F 7/7085
See application file for complete search history.

(56) References Cited

U.S. PATENT DOCUMENTS

| | | | |
|---|---|---|---|
| 6,710,876 B1* | 3/2004 | Nikoonahad | G03F 7/70633 356/399 |
| 6,961,116 B2 | 11/2005 | Den Boef et al. | |
| 10,133,188 B2* | 11/2018 | Jak | G01B 11/26 |

(Continued)

OTHER PUBLICATIONS

International Search Report and Written Opinion of the International Searching Authority directed to related International Patent Application No. PCT/EP2018/072301, dated Jan. 17, 2019; 12 pages.

(Continued)

*Primary Examiner* — Jonathan M Hansen
(74) *Attorney, Agent, or Firm* — Sterne, Kessler, Goldstein & Fox P.L.L.C.

(57) ABSTRACT

A method of determining a parameter of a patterning process applied to an object comprising two features (for example an overlay of the two features) comprises: irradiating the two features of the object with a radiation beam and receiving at least a portion of the radiation beam scattered from the two features of the object. The at least a portion of the radiation beam comprises: a first portion comprising at least one diffraction order and a second portion comprising at least one diffraction order that is different to a diffraction order of the first portion. The method further comprises moderating a phase difference between the first and second portions and combining the first and second portions such that they interfere to produce a time dependent intensity signal. The method further comprises determining the parameter of the patterning process from a contrast of the time dependent intensity signal.

11 Claims, 8 Drawing Sheets

(56) References Cited

U.S. PATENT DOCUMENTS

| | | |
|---|---|---|
| 2009/0195768 A1 | 8/2009 | Bijnen et al. |
| 2010/0123887 A1* | 5/2010 | De Winter .......... G03F 7/70891 |
| | | 355/55 |
| 2011/0134419 A1 | 6/2011 | Fuchs et al. |
| 2014/0118721 A1 | 5/2014 | Shyu et al. |
| 2015/0109624 A1 | 4/2015 | Kreuzer et al. |
| 2015/0227061 A1* | 8/2015 | Tinnemans ........... G03F 9/7088 |
| | | 355/53 |
| 2017/0184977 A1* | 6/2017 | Jak ........................ G01B 11/26 |

OTHER PUBLICATIONS

Huijbregtse et al, "Overlay Performance with Advanced ATHENA™ Alignment Strategies," Metrology, Inspection, and Process Control for Microlithography XVII, Proceedings of SPIE vol. 5038, 2003; pp. 918-928.

* cited by examiner

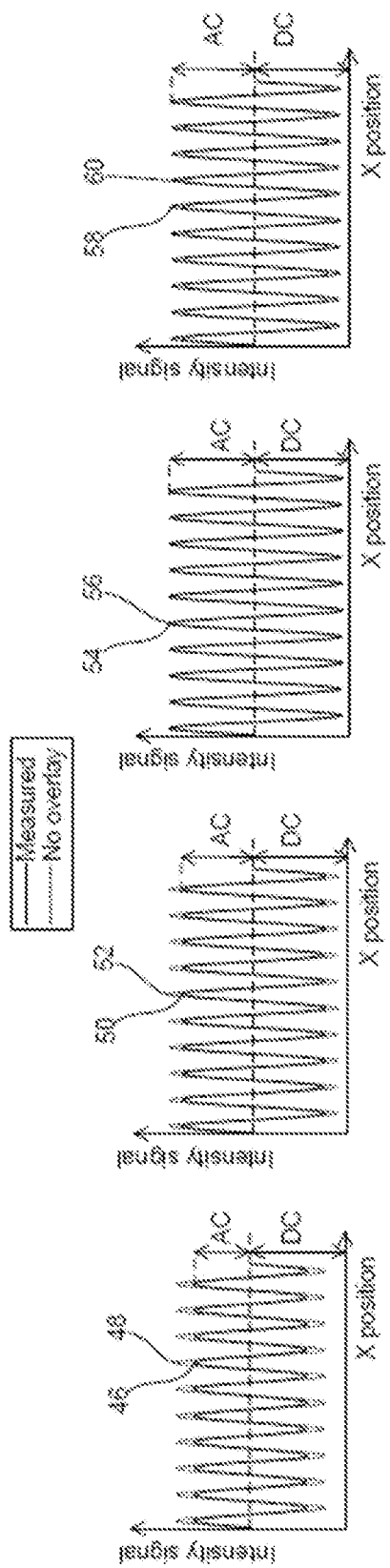
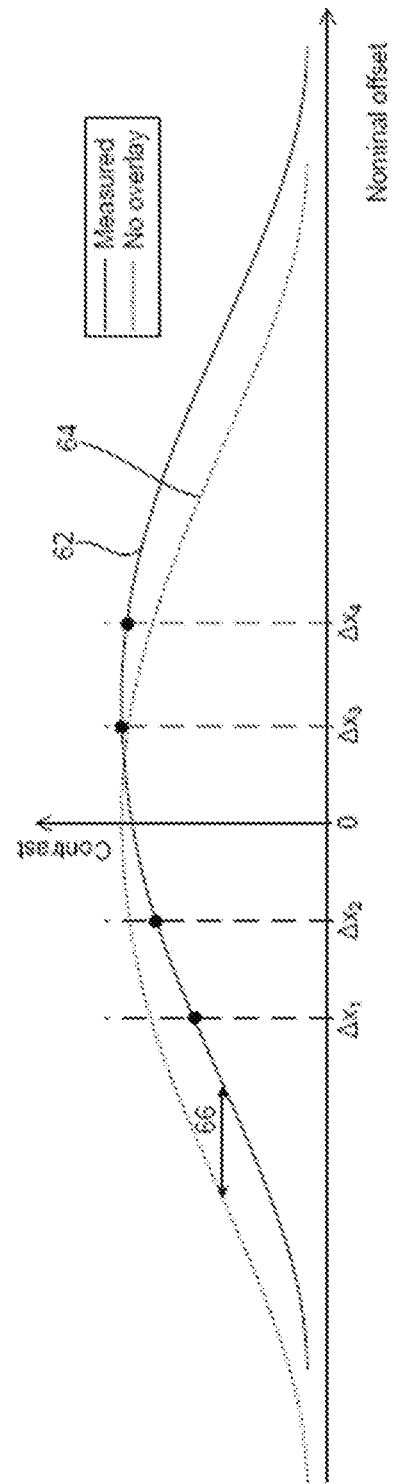
Fig 7B
Fig 7C

METHOD OF MEASURING A PARAMETER AND APPARATUS

FIELD

The present invention relates to methods and apparatus for determining an overlay between two features provided on an object. The present invention has particular application in the field of lithography. The object may, for example, be a silicon wafer and the two features may be marks (for example diffraction gratings) provided in two different process layers of the silicon wafer.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging the pattern onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. The alignment marks aid in the accurate placement of a process layer formed on the substrate relative to previously formed process layers. Various different types of alignment marks and different types of alignment measurement systems are known. Generally, an alignment measurement system measures the position of an alignment mark by irradiating it with a measurement radiation beam, receiving at least a portion of the measurement radiation beam scattered from the alignment mark and determining a position of the alignment mark from this scattered radiation. Alignment measurements are typically made, within a lithographic apparatus, each time a substrate is loaded into the lithographic apparatus, before each process layer is formed.

Once two or more process layers have been formed on a substrate, it may be desirable to measure how accurately the different process layers are aligned. Any shift or offset of one process layer relative to another may be referred to as an overlay and may adversely affect the integrated circuit (if for example the overlay is above a threshold tolerance). In order to measure overlay, each process layer may be provided with one or more overlay mark. The overlay marks may each comprise one or more reflective grating. Such overlay measurements are typically made once both process layers have been formed, for example outside of the lithographic apparatus.

There is continually a need to provide more accurate position measurements, especially to control overlay as product features get smaller and smaller.

As an integrated circuit is fabricated on a silicon wafer, the alignment marks can be buried by various layers of the integrated circuit. The thicknesses and optical properties of these layers can vary according to the type of integrated circuit. One or many of these layers can be opaque and, as a result, a measurement radiation beam may not be able to penetrate through the layers and reach the alignment mark. This represents a big obstacle for state of the art optical alignment and overlay methods.

It is an object of the present invention to provide alternative methods and apparatus that are suitable for determining overlay which at least partially address one or more problems associated with prior art arrangements, whether identified here or not.

SUMMARY

According to a first aspect of the invention, there is provided a method of determining a parameter of a patterning process applied to an object comprising two features, the method comprising: irradiating the two features of the object with a radiation beam; receiving at least a portion of the radiation beam scattered from the two features of the object, the at least a portion of the radiation beam comprising: a first portion comprising at least one diffraction order and a second portion comprising at least one diffraction order that is different to a diffraction order of the first portion; moderating a phase difference between the first and second portions; combining the first and second portions such that they interfere to produce a time dependent intensity signal; and determining the parameter of the patterning process from a contrast of the time dependent intensity signal.

The parameter of the patterning process may be an overlay between two features. It will be appreciated that in this context an overlay between two features provided on an object is intended to refer to a shift or error in a relative position of two features on the object relative to a nominal or intended relative position of the two features. Overlay may alternatively be referred to an alignment error. The object may, for example, be a silicon wafer and the two features may be marks (for example alignment or overlay marks). The marks may be provided in two different process layers of the silicon wafer and may each comprise one or more reflective grating.

The method according to the first aspect is advantageous over existing methods for determining overlay differences, as now discussed.

Typically, prior art overlay measurement techniques that involve diffraction use two gratings provided on different process layers of a substrate. Such prior art overlay techniques work on the principle that an overlay between two gratings results in an asymmetry of the combined gratings, which results in a difference in the intensity of pairs of conjugate diffraction beams (i.e. a difference in intensity between the ±nth order diffraction beams). The intensities of the two conjugate diffractions beams are each determined separately and compared. From this comparison, an overlay can be determined.

The method of the first aspect of the invention also works on the principle that an overlay between two gratings results in an asymmetry of the combined gratings, which results in a difference in the intensity of pairs of conjugate diffraction beams. By combining the first and second portions of the radiation beam that have scattered from the object (and which contain at least one pair of different diffraction orders) the diffraction orders (which may, for example, comprise a pair of conjugate diffraction beams) can interfere (either constructively or destructively). Moderating a phase difference between the first and second portions before they are combined causes the nature of this interference to vary with time such that the intensity of the combined first and second portions is time dependent. A plot of a graph of this intensity as a function of time may be referred to as an interferogram. The inventor of the present invention has realized that the contrast of such an interferogram is dependent on the difference in the intensity of pairs of different diffraction beams. When the difference is zero, which may, for example, correspond to zero overlay, the contrast of the interferogram is maximized. Furthermore, as the difference increases the contrast of the interferogram decreases.

Therefore the contrast of the time varying intensity of the combined first and second portions is dependent on the relative intensities of the different diffraction beams which, in turn, is dependent on the overlay (in a predictable way).

The method according to the first aspect of the invention is advantageous because it provides a significantly better dynamic range than prior art arrangements. This increase in dynamic range is the result of determining of the contrast of a modulated intensity signal, in contrast to prior art arrangements which, for example, involve separately measuring the intensities of conjugate diffraction orders and comparing these. In particular, it this allows weak intensity signals to be separated from dominant background signals, such as ghosts and camera noise. Therefore, the method according to the first aspect of the invention allows a greater range of overlays to be measured.

Another advantage of the method of the first aspect of the present invention is that it shares some common processes with some alignment measurement methods.

As previously explained, an overlay measurement is a measurement of a shift or error in a relative position of two features (for example in two different process layers) relative to a nominal relative position. Such overlay measurements are typically made once both process layers have been formed, for example within a lithographic apparatus. Alignment measurements are typically made, within a lithographic apparatus, once a first process layer has been formed and before a second process layer is formed over the first process layer. An alignment mark (for example a reflective grating) is provided on the first process layer and an alignment measurement involves a measurement of the position of this alignment mark relative to the lithographic apparatus (or a part thereof such as, for example a wafer stage).

Some known alignment measurement processes also involve irradiating the object with a radiation beam, combining first and second portions of the scattered radiation (the first and second portions containing conjugate diffraction beams), moderating a phase difference between the first and second portions before they are combined and determining a moderated intensity of the combined first and second portions. Within alignment measurement processes, the alignment measurement (i.e. the position of the alignment mark) is determined from the position of the interference pattern (relative to a sensor that forms part of the lithographic apparatus).

A benefit of the overlay measurement method of the first aspect of the invention is that substantially the same apparatus can be used for this overlay measurement and for alignment measurement. Furthermore, advantageously, the apparatus for performing the method of the first aspect of the invention may comprise a relatively simple sensor arrangement in comparison with the apparatus used for prior art techniques.

It will be appreciated that precisely how the determined contrast is used to determine the overlay will depend on a number of factors such as: the form of the two features; and a nominal relative position of the two features (i.e. the relative position that the two features were intended to be applied with).

Each of the two features may comprise a plurality of sub-features. Each of the sub-features of a first one of the two features may correspond to a different one of the sub-features of a second one of the two features. By this it is meant that each of the sub-features of one feature may be generally aligned with or may generally overlay a corresponding sub-feature of the other feature such that each pair of such corresponding sub-features may be irradiated by the radiation beam together. The step of irradiating the two features of the object with a radiation beam may comprise sequentially irradiating: each sub-feature of a first one of the features and a corresponding sub-feature of the second one of the features with the radiation beam. For each such pair of corresponding sub-features, the first and second portions may be combined such that they interfere to produce a time dependent intensity signal. The step of determining the parameter of the patterning process may comprise determining the parameter of the patterning process from a contrast of each such time dependent intensity signal.

This arrangement may improve the accuracy of the method since a plurality of measurements (of the determined contrasts) contributes to the overlay measurement.

For example, in one embodiment each of the two features comprises four sub-features.

Each pair of corresponding sub-features may have a different nominal offset.

It will be appreciated that the nominal offset of a corresponding pair of sub-features is intended to mean an offset between the corresponding pair of sub-features that was intended to be provided when the sub-features were applied to the object. That is, it is intended to mean the offset of the corresponding pair of sub-features that would be achieved in the absence of overlays.

This arrangement allows the method to be self-calibrating or self-referencing, as now described.

In principle, in order to determine the overlay from one or more determined contrasts between the two sub-features, various parameters should be taken into account, for example: the form of the pair of sub-features (i.e. their shapes), the depth between the two sub-features (i.e. the distance between the two different process layers on which they are provided) and the scattering efficiencies of the two features. By using a plurality of pairs of corresponding sub-features, each pair having a different (and know) nominal offset, different contrasts will be measured. However, for each corresponding pair of sub-features all of the other parameters that may affect the determined contrasts (for example: the form of the pair of sub-features, the depth between the two sub-features and the scattering efficiencies of the two features) are the same. Therefore, by combining the determined contrasts from the plurality of pairs of corresponding sub-features the dependence of the determined overlay on these other parameters may be removed.

Determining the parameter of the patterning process from the contrast of each time dependent intensity signal may involve fitting a parameterization to the contrast for each pair of corresponding sub-features of the first and second features as a function of the nominal offset of the pair of corresponding sub-features and comparing the fit to a nominal curve.

As previously explained, for zero offset between the two features the contrast is maximized. As the offset increases, or decreases, from zero the contrast will decrease. Therefore, with zero overlay, a curve of the contrast as a function of the nominal offset will have a maximum at zero nominal offset and will fall off as the magnitude of the nominal offset increases. Furthermore one would expect the curve to fall off symmetrically on either side of the maximum. For example, the contrast as a function of nominal offset may be expected to be substantially parabolic. For a situation with a non-zero overlay, a curve of the contrast as a function of nominal offset will be shifted along the nominal offset axis by an amount equal (at least in magnitude) to the overlay, such that the maximum is located not at zero nominal offset but where the nominal offset is equal in magnitude to the overlay.

Therefore, in one embodiment a parabola is fitted to the determined contrast of each of the pairs of corresponding sub-features as a function of the nominal offset of the sub-feature and the overlay is determined from the position of the maximum of the curve.

For such embodiments, each of the two features may comprise three or more sub-features. In a preferred embodiment, the two features may comprise four sub-features.

The first portion and the second portion may each be formed from the interference between a portion of radiation scattered from a first of the two features and a portion of radiation scattered from a second of the two features.

Moderating the phase difference between the first and second portions before they are combined may be achieved by moving the object relative to the radiation beam. For example, the object may be moved relative to the radiation beam such that the radiation beam scans across the object. Alternatively, the object may be moved relative to the radiation beam such that the radiation beam moves back and forth across the object.

Alternatively, moderation of the phase difference between the first and second portions before they are combined may be achieved using a suitable adjustable optical element such as, for example, a retarder.

The method may further comprise forming an interferogram from which the or each contrast is determined.

The contrast may be defined as the ratio of the amplitude of an alternating current signal to the amplitude of a direct current signal.

The radiation beam may comprise infrared radiation.

For example, the radiation beam may comprise radiation having a wavelength in a range of 800 nm to 2500 nm (2.5 µm). More preferably, the radiation beam may comprise radiation having a wavelength in a range of 1500 nm to 2000 nm.

The use of infrared radiation (as opposed to visible radiation) allows the radiation beam to penetrate further into the object and/or may allow the radiation beam to propagate through layers that would be opaque to visible radiation. Therefore such embodiments wherein the radiation beam comprises infrared radiation have particular application for relatively thick objects, for example with overlay marks disposed up to 5 to 10 µm below the surface of the object. Additionally or alternatively, embodiments wherein the radiation beam comprises infrared radiation have particular application for objects wherein overlay marks are disposed below layers that would be opaque to visible radiation such as, for example, hard masks formed from amorphous carbon. Such hard masks are used, for example, during 3D-NAND fabrication.

In such embodiments, the overlay measurement signals are expected to be low. The method of the first aspect of the invention is particularly well suited for such embodiments due to the increased dynamic range that it provides. Therefore, there may be said to be synergy between the use of infrared radiation and the method according to the first aspect of the invention since together they both act to provide an improvement in overlay measurements for arrangements with reduced overlay measurement signals.

Additionally or alternatively, the radiation beam may comprise X-ray radiation and/or visible light radiation.

According to a second aspect of the invention there is provided a method of determining a parameter of a patterning process applied to an object comprising two features, the method comprising: irradiating the object with a radiation beam; receiving at least a portion of the radiation beam scattered from the object, the at least a portion of the radiation beam comprising: a first portion comprising at least one diffraction order and a second portion comprising at least one diffraction order that is different to a diffraction order of the first portion; wherein the first portion and the second portion are each formed from the interference between a portion of radiation scattered from a first of the two features of the object and a portion of radiation scattered from a second of the two features of the object; moderating a phase difference between the first and second portions, combining the first and second portions such that they interfere to produce a time dependent intensity signal; and determining the parameter of the patterning process applied to the object from the time dependent intensity signal.

Each of the two features may comprise a plurality of sub-features. The step of irradiating the object with a radiation beam may comprise sequentially irradiating: each sub-feature of a first one of the features and a corresponding sub-feature of the second one of the features with the radiation beam. For each such pair of corresponding sub-features, the first and second portions may be combined such that they interfere to produce a time dependent intensity signal. The step of determining the parameter of the patterning process applied to the object may comprise determining the parameter between the two features from a contrast of each such time dependent intensity signal.

Each pair of corresponding sub-features may have a different nominal offset.

Determining the parameter of patterning process from the contrast of the time dependent intensity signals may involve fitting a parameterization to a determined contrast for each pair of corresponding sub-features of the first and second features as a function of the nominal offset of the pair of corresponding sub-features and comparing the fit to a nominal curve.

Moderating the phase difference between the first and second portions before they are combined may be achieved by moving the object relative to the radiation beam. For example, the object may be moved relative to the radiation beam such that the radiation beam scans across the object. Alternatively, the object may be moved relative to the radiation beam such that the radiation beam moves back and forth across the object.

Alternatively, moderation of the phase difference between the first and second portions before they are combined may be achieved using a suitable adjustable optical element such as, for example, a retarder.

The method may further comprise forming an interferogram from which the or each contrast is determined.

The contrast may be defined as the ratio of the amplitude of an alternating current signal to the amplitude of a direct current signal.

The radiation beam may comprise infrared radiation.

For example, the radiation beam may comprise radiation having a wavelength in a range of 800 nm to 2500 nm (2.5 μm). More preferably, the radiation beam may comprise radiation having a wavelength in a range of 1500 nm to 2000 nm.

The use of infrared radiation (as opposed to visible radiation) allows the radiation beam to penetrate further into the object and/or may allow the radiation beam to propagate through layers that would be opaque to visible radiation. Therefore such embodiments wherein the radiation beam comprises infrared radiation have particular application for relatively thick objects, for example with overlay marks disposed up to 5 to 10 μm below the surface of the object. Additionally or alternatively, embodiments wherein the radiation beam comprises infrared radiation have particular application for objects wherein overlay marks are disposed below layers that would be opaque to visible radiation such as, for example, hard masks formed from amorphous carbon. Such hard masks are used, for example, during 3D-NAND fabrication.

In such embodiments, the overlay measurement signals are expected to be low. The method of the first aspect of the invention is particularly well suited for such embodiments due to the increased dynamic range that it provides. Therefore, there may be said to be synergy between the use of infrared radiation and the method according to the first aspect of the invention since together they both act to provide an improvement in overlay measurements for arrangements with reduced overlay measurement signals.

Additionally or alternatively, the radiation beam may comprise X-ray radiation and/or visible light radiation.

According to a third aspect of the invention there is provided a method comprising: applying a first process layer to an object, the first process layer comprising a first feature; applying a second process layer to an object, the second process layer comprising a second feature; and determining a parameter of the patterning process of applying the first and second process layers to the object using the method of the first or second aspects of the invention.

The first feature may comprise a plurality of sub-features. The second feature may comprise a plurality of sub-features, each corresponding to a different one of the sub-features of the first feature. Each pair of corresponding sub-features may be applied with a different nominal offset.

It will be appreciated that the nominal offset of a corresponding pair of sub-features is intended to mean an offset between the corresponding pair of sub-features that was intended to be provided when the sub-features were applied to the object. That is, it is intended to mean the offset of the corresponding pair of sub-features that would be achieved in the absence of overlays.

The object may, for example, be a silicon wafer and the two features may be overlay marks. The overlay marks may each comprise one or more reflective grating(s).

According to a fourth aspect of the invention there is provided an apparatus for determining a parameter of a patterning process applied to an object comprising two features, the apparatus comprising: a radiation source operable to irradiate the object with a radiation beam; a measurement system operable to receive at least a portion of the radiation beam scattered from the object and further operable to determine the parameter of the patterning process therefrom, wherein the measurement system comprises: optics configured to combine a first portion and a second portion of the at least a portion of the measurement radiation beam scattered from the object; and a sensor configured to determine an intensity of the combined first and second portions; and a phase control mechanism operable to moderate a phase difference between the first and second portions before they are combined such that the intensity of the combined first and second portions is time dependent; and wherein the measurement system is operable to determine the parameter of the patterning process between the two features from a contrast of the time dependent intensity of the combined first and second portions.

The parameter of the patterning process may be an overlay between the two features. The apparatus according to the fourth aspect of the invention may be considered to be an overlay measurement system.

The apparatus according to the fourth aspect of the invention allows the methods according to the first and second aspects to be performed. The apparatus according to the fourth aspect of the invention is therefore advantageous over existing apparatus for determining overlays, as discussed above in connection with the methods of the first and second aspects of the invention.

In particular, a benefit of the apparatus of the third aspect of the invention is that it can be used for both overlay measurement and for alignment measurement.

Where applicable, the apparatus according to the fourth aspect of the invention may have features corresponding to any of the above-described features of the methods according to the first or second aspects.

The phase control mechanism may comprise: a support structure for supporting an object; and a movement mechanism operable to move the support structure relative to the radiation source.

Such an arrangement allows an object supported by the support structure to be moved such that the radiation beam scans across the object. Additionally or alternatively, it allows an object supported by the support structure to be moved such that the radiation beam oscillates back and forth across the object.

Alternatively, the phase control mechanism may comprise a suitable adjustable optical element such as, for example, a retarder.

The movement mechanism may be operable to move the support structure such that a plurality of regions of the object are successively irradiated by the radiation beam and the measurement system may be operable to determine a contrast of the time dependent intensity of the combined first and second portions for each such region.

This allows, for example a plurality of sub-features to be successively irradiated and for a contrast of the time dependent intensity of the combined first and second portions to be determined for each such sub-feature.

The measurement system may be further operable fit a parameterization to the determined contrast for each region of the object as a function of a nominal offset of the region and to compare the fit to a nominal curve so as to determine the parameter of the patterning process.

The radiation beam may comprise infrared radiation.

For example, the radiation beam may comprise radiation having a wavelength in a range of 800 nm to 2500 nm (2.5 μm). More preferably, the radiation beam may comprise radiation having a wavelength in a range of 1500 nm to 2000 nm.

Additionally or alternatively, the radiation beam may comprise X-ray radiation and/or visible light radiation.

The apparatus may be configured to implement the method of the first aspect of the invention.

According to a fifth aspect of the invention there is provided an apparatus comprising: a radiation source operable to irradiate an object with a radiation beam; a phase control mechanism operable to moderate a phase difference between a first portion of the radiation scattered from the object and a second portion of the radiation scattered from the object; and a measurement system operable to receive at least a portion of the measurement radiation beam scattered from the object, wherein the measurement system comprises: optics configured to combine the first portion and the second portion of the at least a portion of the measurement radiation beam scattered from the object, the measurement system further operable to determine from a time dependent intensity of the combined first and second portions either: (a) a position a feature on the object relative to part of the apparatus or (b) a relative position of two features on the object.

Advantageously, such an apparatus according to the fourth aspect of the invention can function either as an alignment (or position) sensor or as an overlay sensor.

Where applicable, the apparatus according to the fourth aspect of the invention may have features corresponding to any of the above-described features of the method according to the first aspect.

Where applicable, the apparatus according to the fourth aspect of the invention may any of the above-described features of the apparatus according to the third aspect.

The apparatus according to the fourth aspect of the invention may be considered to be an overlay measurement system.

The measurement system may further comprise a sensor configured to determine an intensity of the combined first and second portions.

The measurement system may be operable to determine a relative position of two features on the object in dependence on a contrast of the time dependent intensity of the combined first and second portions.

The phase control mechanism may comprise: a support structure for supporting an object; and a movement mechanism operable to move the support structure relative to the radiation source.

Such an arrangement allows an object supported by the support structure to be moved such that the radiation beam scans across the object.

Alternatively, the phase control mechanism may comprise a suitable adjustable optical element such as, for example, a retarder.

The radiation beam may comprise infrared radiation. Additionally or alternatively, the radiation beam may comprise X-ray radiation and/or visible light radiation.

The apparatus may be configured to implement the method of the first aspect of the invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7B is a schematic representation of an interferogram for each pair of corresponding sub-features shown in FIG. 7A formed by scanning a radiation beam over the pair of corresponding sub-features, the interferogram being a graph of the intensity of a combination of at least one pair of conjugate diffraction orders scattered from the pair of corresponding sub-features as a function of scanning position;

FIG. 7C is a curve of the contrast of each of the interferograms shown in FIG. 7B as a function of the nominal offset $\Delta X_n$ of the pair of corresponding sub-features from which it was formed also shown is a fitted curve (solid line) and a nominal curve (dotted line) that would be expected for zero overlay.

DETAILED DESCRIPTION

Figure 1B:
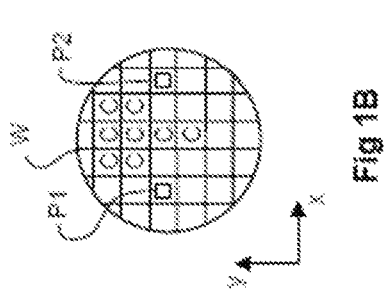
FIG. 1B shows a plan view of a substrate W which may represent either of the two substrates of FIG. 1A.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1C:
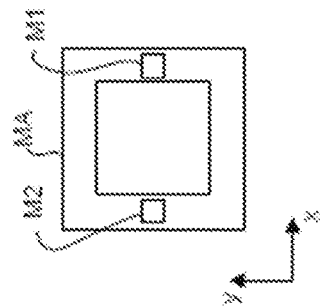
FIG. 1C shows a plan view of a patterning device, which may be used by the lithographic system of FIG. 1A.
Figure 1A:
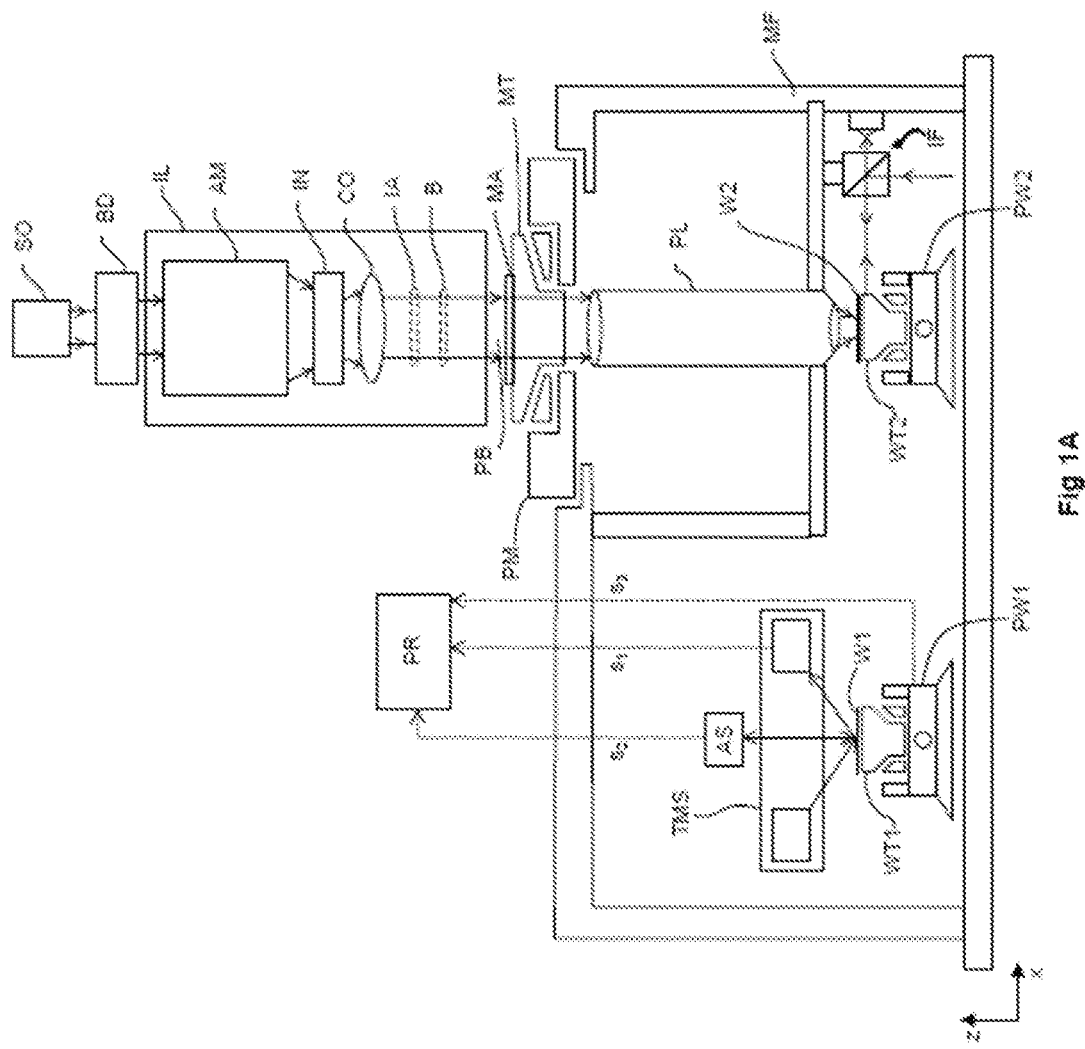
FIG. 1A schematically depicts a lithographic system according to an embodiment of the invention.

FIG. 1A schematically depicts a lithographic apparatus according to a particular embodiment of the invention. The apparatus comprises:

- an illumination system (illuminator) IL for conditioning a beam PB of radiation (e.g. UV radiation or DUV radiation);
- a frame MF;
- a support structure (e.g. a mask table) MT to support a patterning device (e.g. a mask) MA;
- two substrate tables (e.g. a wafer table) WT1, WT2, each for holding a substrate (e.g. a resist coated wafer) W1, W2 respectively; and
- a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move a substrate table WT1, WT2 along a scanning path relative to the radiation beam such that the radiation beam scans across a target portion C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure. The preparatory steps may include mapping the surface of the substrate using a level sensor LS and measuring the position of alignment marks on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS (as will be described more fully below) and topography measurement system TMS prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table with is at that time disposed on the left and substrate table WT2 will generally refer to the substrate table with is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multipole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

The illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a plane of the illuminator IL which is conjugate to that of the patterning device MA (and the substrate W). Such a plane may be referred to as a field plane. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjustor IA (shown schematically in FIG. 1A). The intensity adjustor IA is operable to attenuate the radiation beam on opposing sides of the radiation beam, as now described. The intensity adjustor IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit.

The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor α to the radiation beam PB then the distance travelled by each conjugate point in a given time period will be less than that travelled by the corresponding point on the patterning device by a factor of α. Therefore the magnitude of the velocity $|v_{WT}|$ of the substrate table WT2 should be $|v_{MT}|/\alpha$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies. A single wafer may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the substrate table WT2 may be operable to move the substrate W so as to position the next target portion so that it is ready to be scanned through the exposure region.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described further below, the alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto).

The topography measurement system TMS may be operable to output a signal $s_1$ that is indicative of the height of the substrate W1. The alignment system AS may be operable to output a signal $s_2$ that is indicative of the position of one or more alignment marks on the substrate W1 or the substrate table WT. The output signals $s_1$, $s_2$ are received by a processor PR.

The signal $s_1$ output by the topography measurement system TMS may be analyzed by processor PR to determine the height of the substrate W1. The processor PR may be used to generate a map of the topography of the substrate W1. The processor PR may comprise a memory and may be operable to store information relating to the topography of the entire substrate W1. The topography of the surface of a substrate W1 may be referred to as a height map. During exposure of a substrate W (on the right-hand side of FIG. 1A) it is desirable to keep the substrate W in a focal plane of the projection system PL. In order to achieve this, the substrate table WT2 may be moved in the z direction, said movement of the substrate table WT2 being determined in dependence on the topography of the surface of a substrate W (as previously determined by the topography measurement system TMS).

The signal $s_2$ output by the alignment system AS may be analyzed by processor PR to determine the positions of one or more alignment marks on the substrate W1 and the substrate table WT1. The first substrate positioning device PW1 may be operable to move the substrate table WT1 so as to position each alignment mark below the alignment system AS in turn while a position sensor IF (either position sensor IF or another position sensor dedicated to the measurement station) measures the substrate table WT1. As an initial step, the first substrate positioning device PW1 may be used to position one or more alignment marks on the substrate table WT1 below the alignment system AS and the position of each of the alignment marks is determined. Subsequently, the first substrate positioning device PW1 may be used to position one or more alignment marks on the substrate W1 below the alignment system AS and the position of each of the alignment marks is determined. For example, the position of the substrate table WT1 as determined by the position sensor may be recorded while each alignment mark is directly below the alignment sensor AS. Effectively, the measurement of the position of the alignment marks on the substrate table WT1 allows the position of the substrate table WT1 as determined by the position sensor (for example sensor IF) to be calibrated (relative to the frame MF to which the alignment system AS is connected). Measurement of the position of the alignment marks on the substrate W1 allows the position of the substrate W1 relative to the substrate table WT1 to be determined.

The processor PR may be considered to be a digital signal processing system. The processor PR may comprise, e.g., one or more microprocessors or one or more Field-Programmable Gate Arrays (FPGA), etc.

In addition to data from the alignment system AS and the topography measurement system TMS, the processor PR also receives substrate table WT1 position information (see signal $s_3$ in FIG. 1A) from first substrate positioning device PW1 and/or from a position sensor (for example sensor IF). Since the substrate is fixed to (typically via a clamp) the substrate table WT1, the information from the alignment system AS can be used to convert position information relating to the substrate table WT1 to position information relating to the substrate W.

The apparatus may comprise a lithographic apparatus control unit (not shown) which controls all of the movements and measurements of the various actuators and sensors described. The lithographic apparatus control unit may include signal processing and data processing capacity to implement desired calculations relevant to the operation of the apparatus. The processor PR may form part of the lithographic apparatus control unit. In practice, lithographic apparatus control unit may be realized as a system of many sub-units, each handling the real-time data acquisition, processing and control of a subsystem or component within the apparatus. For example, one processing subsystem may be dedicated to servo control of the first and second substrate positioning devices PW1, PW2. Separate units may even handle coarse and fine actuators, or different axes. Another unit might be dedicated to the readout of the position sensor IF (and, if used, another position sensor for the measurement station). Overall control of the apparatus may be controlled by a central processing unit, communicating with these sub-systems processing units, with operators and with other apparatuses involved in the lithographic manufacturing process.

The lithographic apparatus described above with reference to FIGS. 1A, 1B and 1C can be used in the manufacture of integrated circuits. Typically, such integrated circuits are formed on a substrate W by fabrication of a plurality of process layers. Each process layer is printed on the substrate W sequentially in the lithographic apparatus. For example, a layer of photoresist may be provided on the substrate and the photoresist covered wafer W may be loaded into the lithographic apparatus for exposure to a patterned radiation beam. After each layer has been printed within the lithographic apparatus, the substrate W is removed from the lithographic apparatus for further processing to complete fabrication of that process layer. Following this subsequent processing, the substrate W may be provided with another layer of photoresist and may be loaded back into the lithographic apparatus for printing of the next process layer.

The above described alignment system AS allows the position of the substrate W to be measured accurately. Furthermore, this information is used during the subsequent exposure of the substrate W to the radiation beam PB patterned by patterning device MA. Therefore, the above described alignment system AS provides control over the accurate placement of subsequent process layers.

Once two or more process layers have been formed on a substrate W, it may be desirable to measure how accurately the different process layers are aligned. Any shift or offset of one process layer relative to another may be referred to as an overlay and may adversely affect the integrated circuit (if for example the overlay is above a threshold tolerance). In order to measure overlays, each process layer may be provided with one or more overlay mark. That is, one or more overlay marks may be printed onto the substrate W during the printing of each process layer within the lithographic apparatus. The overlay marks may each comprise one or more reflective grating. Such overlay measurements are typically made once both process layers have been formed, for example outside of the lithographic apparatus.

It will be appreciated as used herein, overlay is intended to refer to a shift or error in a relative position of two features or process layers on an object (for example a substrate W) relative to a nominal or intended relative position of the two features. Overlay error generally refers to an error in the overlay measurement.

Overlay measurement techniques that involve diffraction use two gratings provided on different process layers of a substrate. The general principles of diffractive overlay measurement techniques are now discussed with reference to FIGS. 2A, 2B and 3.

Figure 2A:
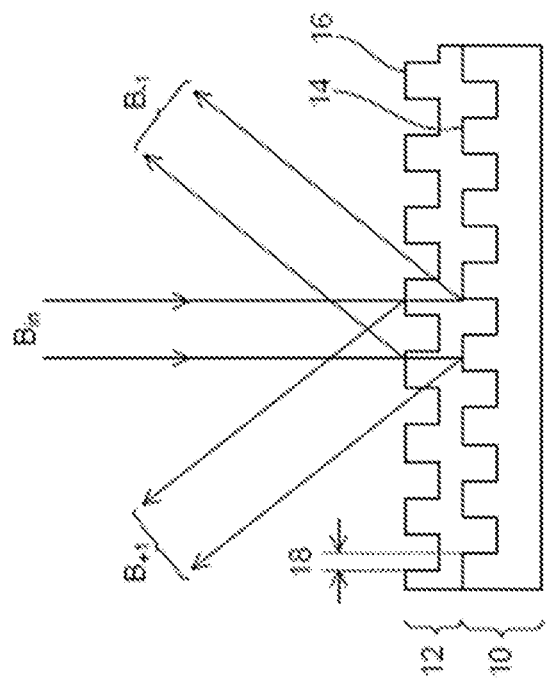
FIG. 2A is a schematic illustration of an object provided with two marks, the two marks being aligned such that the combination of the two marks is symmetric, also showing a radiation beam incident on the object and forming a pair of conjugate diffraction order beams.
Figure 2B:
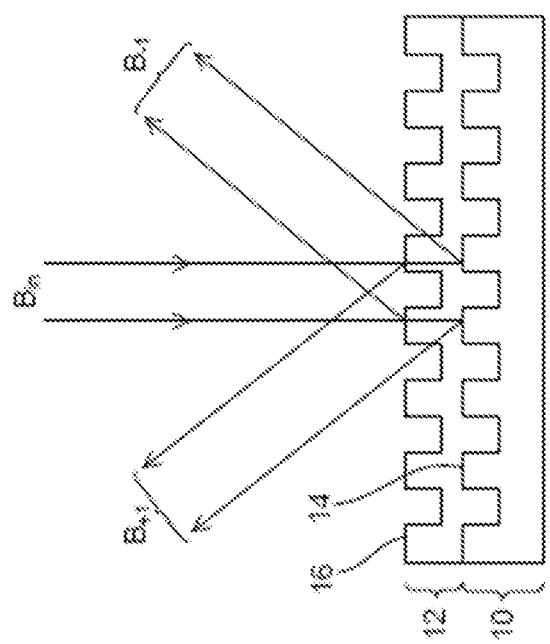
FIG. 2B is a schematic illustration of an object provided with two marks, the two marks having an offset such that the combination of the two marks is not symmetric, also showing a radiation beam incident on the object and forming a pair of conjugate diffraction order beams.

FIGS. 2A and 2B show, schematically, a portion of an object that is provided with two process layers 10, 12. The second process layer 12 may be referred to as being above the first process layer 10, meaning that the second process layer 12 is closer to an upper surface of the object than the first process layer 10. The first process layer 10 is provided with a first mark 14 in the form of a reflective diffraction grating formed on a surface of the process layer 10. Similarly, the second process layer 12 is provided with a second mark 16 in the form of a reflective diffraction grating.

Each of the gratings 14, 16 has the same pitch and is formed from a plurality of square profile grooves, the width of each groove being substantially the same as the separation between adjacent grooves. As shown in FIG. 2A, the two marks 14, 16 are aligned whereas, as shown in FIG. 2B, there is an offset or overlay 18 between the two marks 14, 16.

To determine the overlay 18 between the two marks, the object is irradiated with a radiation beam $B_{in}$. In particular, a portion of the overlapping marks 14, 16 is irradiated with a radiation beam $B_{in}$. The radiation scatters from the marks 14, 16. The incident radiation beam $B_{in}$ may be considered to be diffracted by the marks 14, 16 together and the diffracted radiation interferes so as to form a plurality of diffraction orders. In FIGS. 2A and 2B the ±1st order diffraction beams $B_{+1}$, $B_{-1}$ respectively are shown. It will be appreciated that higher order diffraction beams may also be generated.

In the following a pair of conjugate diffraction orders is intended to mean the ±nth order diffraction beams. For example the +1st order diffraction beam $B_{+1}$ may be considered to be conjugate to the −1st order diffraction beam $B_{-1}$, the +2nd order diffraction beam $B_{+2}$ may be considered to be conjugate to the −2nd order diffraction beam $B_{-2}$ and so on.

Generally these diffractive overlay measurement techniques work on the principle that an overlay between two gratings 14, 16 results in a difference in the intensity of pairs of conjugate diffraction beams. For example, with no overlay, as shown in FIG. 2A, the ±1st order diffraction beams $B_{+1}$, $B_{-1}$ have substantially the same intensity. However, with a non-zero overlay 18, as shown in FIG. 2B, the intensity of the +1st order diffraction beam $B_{+1}$ will, in general, be different to the intensity of the −1st order diffraction beam $B_{-1}$. Prior art overlay measurement techniques involve separate determination of the intensities of two conjugate diffractions beams. These separately determined intensities are compared and, from this comparison, an overlay can be determined. The overlay is proportional to the difference in the intensities of the ±1 st order diffraction beams $B_{+1}$, $B_{-1}$.

Figure 3:
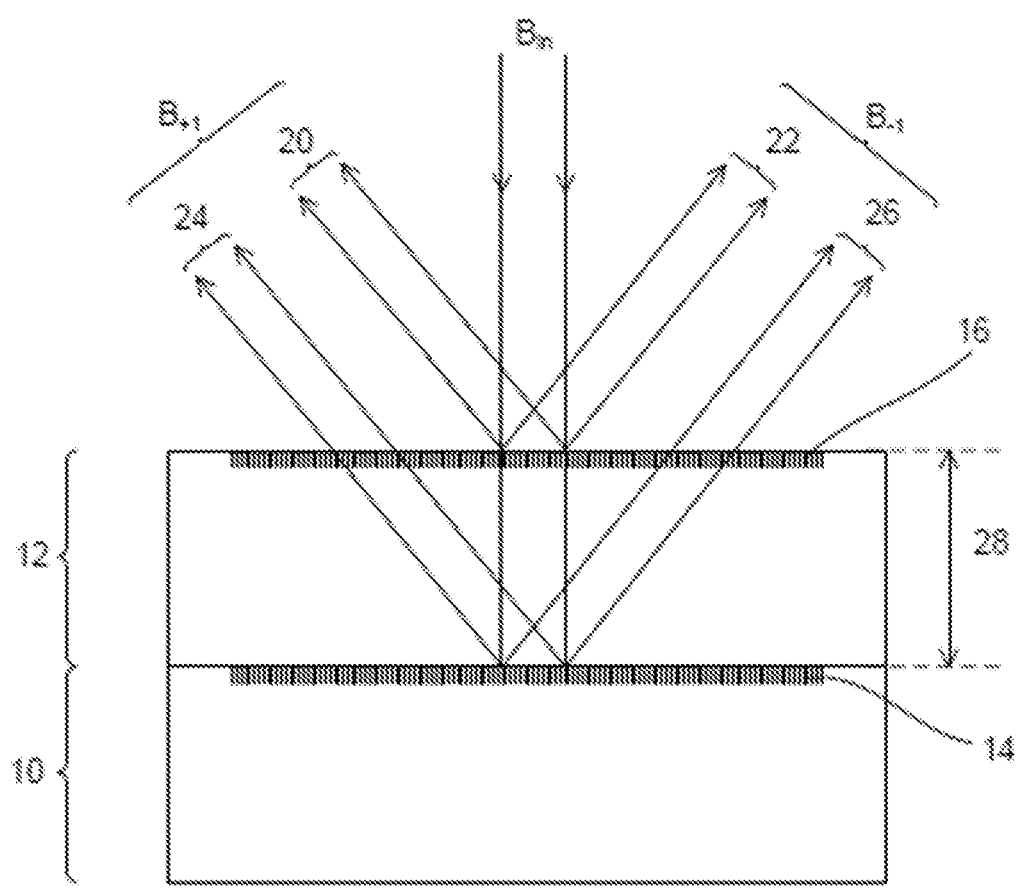
FIG. 3 is a schematic illustration of a radiation beam scattering from two overlay marks provided in different layers of an object to form a pair of conjugate diffraction order beams.

That an overlay between two gratings 14, 16 results in a difference in the intensity of pairs of conjugate diffraction beams will now be explained with reference to FIG. 3. FIG. 3 is an alternative schematic illustration of the radiation beam $B_{in}$ scattering from the two marks 14, 16 provided in different layers 10, 12 of an object to form a pair of conjugate diffraction order beams $B_{+1}$, $B_{-1}$.

As the radiation beam $B_{in}$ is incident on the second process layer 12, a first portion of the radiation beam $B_{in}$ scatters from the second mark 16. In particular, the first portion of the radiation beam $B_{in}$ is diffracted by the second mark 16 and the diffracted radiation interferes so as to form a plurality of diffraction orders. In FIG. 3, only the +1st order diffraction beam 20 and the −1st order diffraction beam 22 are shown although it will be appreciated that in general higher order diffraction beams are also generated.

A second portion of the radiation beam $B_{in}$ propagates into the second process layer 12 and is incident on the first mark 14. At least a portion of this second portion of the radiation beam $B_{in}$ scatters from the first mark 14. In particular, part of the second portion of the radiation beam $B_n$ is diffracted by the first mark 14 and the diffracted radiation interferes so as to form a plurality of diffraction orders. In FIG. 3, only the +1st order diffraction beam 24 and the −1st order diffraction beam 26 are shown although it will be appreciated that in general higher order diffraction beams are also generated.

As indicated schematically in FIG. 3, each of the ±1 st order diffraction beams $B_{+1}$, $B_{-1}$ that are shown in FIGS. 2A and 2B and which can be considered to have been produced from the radiation beam $B_{in}$ scattering from the two marks 14, 16 together, is formed from some radiation that has scattered from the first mark 14 and some radiation that has scattered from the second mark 16. In particular, the +1st order diffraction beam $B_{+1}$ is a combination of the +1st order diffraction beam 20 from the second mark 16 and the +1st order diffraction beam 24 from the first mark 14. Similarly, the −1st order diffraction beam $B_{+1}$ is a combination of the −1st order diffraction beam 22 from the second mark 16 and the −1st order diffraction beam 26 from the first mark 14.

The +1st order diffraction beams 20, 24 interfere to form the +1 st order diffraction beam $B_{+1}$ and the −1st order diffraction beams 22, 26 interfere to form the −1st order diffraction beam $B_{-1}$. Due to the thickness 28 of the second process layer 12, there is an optical path length difference both between the two +1st order diffraction beams 20, 24 and between the two −1st order diffraction beams 22, 26. This will result in a fixed phase difference between each pair of interfering diffraction beams. In particular, the phase difference that results between the +1st order diffraction beams 20, 24 is equal to the phase difference that results between the −1st order diffraction beams 22, 26. For example, the phase of both of the diffraction beams 24, 26 generated by the first mark 14 may lag behind the phase of both of the diffraction beams 20, 22 generated by the second mark 16.

The phase of each individual diffraction beam that results from the scattering from a diffraction grating is dependent on the position of the incident radiation beam relative to the diffraction grating. If the beam spot of the incident radiation beam is scanned over the diffraction grating then the phase of the diffraction beams formed will vary. Therefore, in addition to the fixed phase difference that results from the optical path length difference for the radiation scattering from the different marks 14, 16, the phase of each individual diffraction beam 20, 22, 24, 26 that results from the scattering from one of the marks 14, 16 is dependent on the position of the incident radiation beam $B_{in}$ relative to that mark 14, 16. Therefore, if there is an overlay then there will be an additional phase difference between each pair of interfering diffraction beams. The phase difference that results between the +1st order diffraction beams 20, 24 due to such overlays has an opposite sign to the phase difference that results between the −1st order diffraction beams 22, 26. This introduces an asymmetry between the intensity of the ±1 st order diffraction order beams $B_{+1}$, $B_{-1}$.

Figures 4A, 4B:
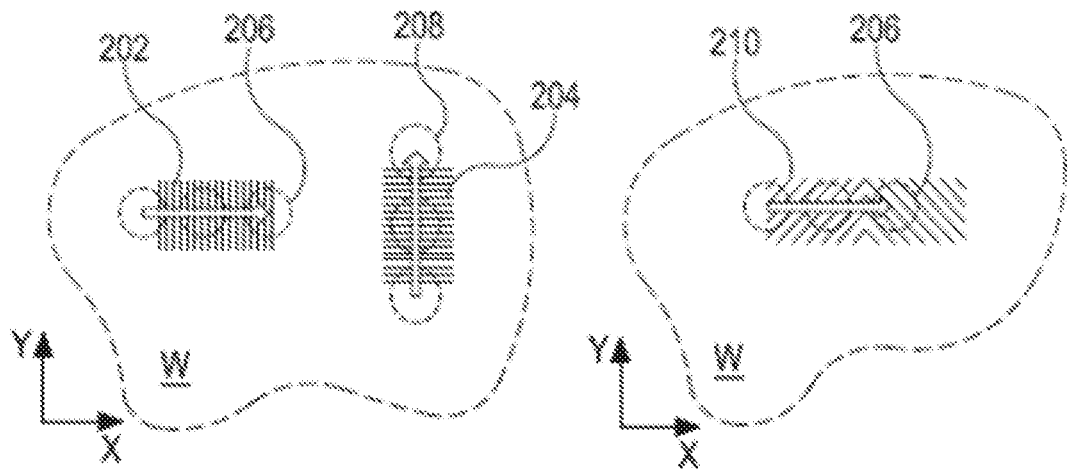
FIGS. 4(a) and 4(b), comprising FIG. 4(a) and FIG. 4(b), schematically depicts various forms of overlay mark that may be provided on a substrate.

FIG. 4(a) shows examples of marks 202, 204, that may be provided on substrate W for the measurement of X-position overlay and Y-position overlay respectively. Each mark in this example comprises a series of bars formed in a process layer applied to or etched into a substrate W. The bars are regularly spaced and act as grating lines so that the mark may be regarded as a diffraction grating with a sufficiently well-known spatial period (pitch). The bars on the X-direction mark 202 are parallel to the Y-axis to provide periodicity in the X direction, while the bars of the Y-direction mark 204 are parallel to the X-axis to provide periodicity in the Y direction.

A pair of substantially identical marks may be provided on two different process layers of the substrate W. An overlay measurement system according to an embodiment of the invention is operable to scan each such pair of marks optically with a spot 206 (X direction), 208 (Y direction) of radiation, to obtain a periodically-varying difference in the intensities of conjugate pairs of diffraction beams. The time variation in the intensities of one or more conjugate pairs of diffraction beams is analysed to determine an overlay, as discussed further below with reference to FIGS. 7A to 8. The scanning movement is indicated schematically by a broad arrow, with progressive positions of the spot 206 or 208 indicated in dotted outline.

The overlay measurement system according to an embodiment of the invention may be generally of the form of an alignment system, which is modified such that the analysis of the measured signal allows an overlay to be determined (again, as described further below, with reference to FIGS. 7A to 8). For example, the overlay measurement system according to an embodiment of the invention may be generally of the form described in U.S. Pat. No. 6,961,116 (den Boef et al), which is hereby incorporated in its entirety by reference.

FIG. 4(b) shows a modified mark 210 for use with a similar overlay measurement system, whereby X-position overlay and Y-position overlay can be obtained through a single optical scan with the illumination spot 206 or 208. The mark 210 has bars arranged at 45 degrees to both the X- and Y-axes. The use of such modified marks 210 for alignment measurements may be performed using the techniques described in published patent application US 2009/195768 A (Bijnen et al), which is hereby incorporated in its entirety by reference.

Figure 5:
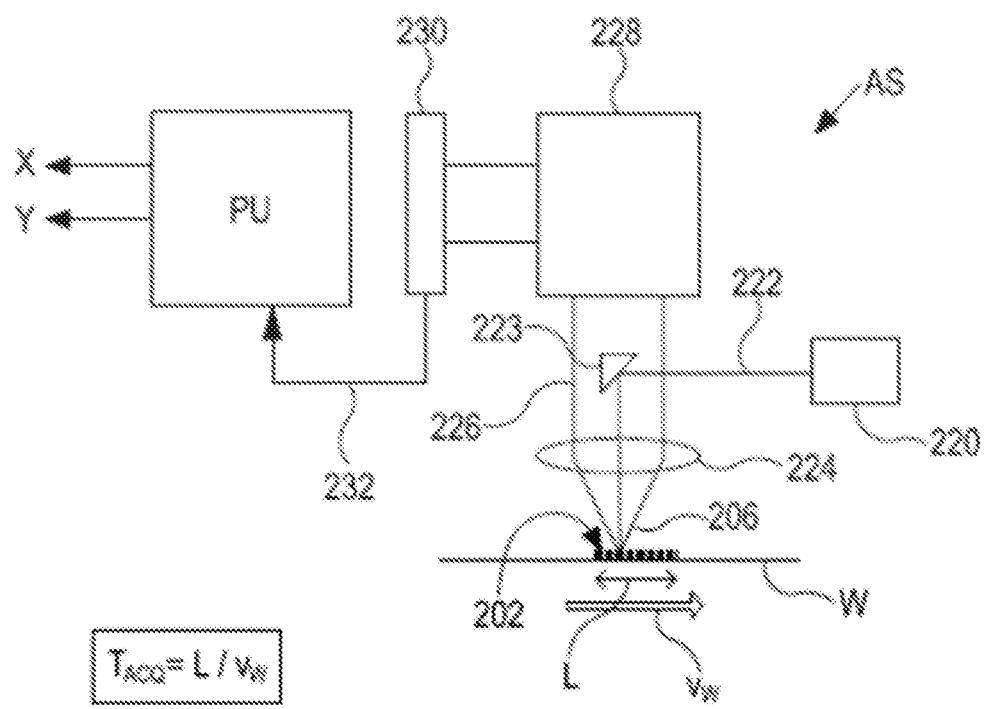
FIG. 5 is a schematic block diagram of a first overlay apparatus.

FIG. 5 is a schematic block diagram of a known alignment sensor AS. The overlay measurement system according to an embodiment of the invention may be generally of the form of this alignment sensor AS. The components and the mode of operation of the alignment sensor AS are now described.

Illumination source 220 provides a measurement beam 222 of radiation of one or more wavelengths, which is diverted by a spot mirror 223 through an objective lens 224 onto a mark 202 (for example an alignment mark or a pair of overlapping overlay marks) located on substrate W. The measurement beam 222 may comprise radiation of any suitable wavelengths. For example, the measurement beam 222 may comprise visible and/or infrared radiation. In some embodiments, the measurement beam 222 may comprise radiation with wavelengths in the range 400 nm to 2000 nm. As indicated schematically in FIG. 5, in the example of the present alignment sensor based on U.S. Pat. No. 6,961,116 mentioned above, the illumination spot 206 by which the mark 202 is illuminated may be slightly smaller in diameter then the width of the mark itself.

Radiation diffracted by the mark 202 is picked up by an objective lens 224 and collimated into an information-carrying beam 226. A self-referencing interferometer 228 is of the type disclosed in U.S. Pat. No. 6,961,116 mentioned above, and processes beam 226 and outputs separate beams (for each wavelength) onto a sensor array 230. The spot mirror 223 serves conveniently as a zero order stop at this point, so that the information carrying beam 226 comprises only higher order diffracted radiation from the mark 202 (this may not be essential to the measurement, but improves signal to noise ratios). Intensity signals 232 from individual sensors in a sensor grid 230 are provided to a processing unit PU. By a combination of optical processing in the block 228 and computational processing in the unit PU, alignment and/or overlay information may be obtained.

The radiation beams with different wavelengths may be multiplexed and demultiplexed optically so as to be processed simultaneously, and/or they may be multiplexed by time division or frequency division.

Referring to the measurement process in more detail, an arrow labelled $V_W$ in FIG. 5 illustrates a scanning velocity with which spot 206 traverses a length L of the mark 202. In this example, the alignment system AS and spot 206 remain stationary, while it is the substrate W that moves with velocity $V_W$. The alignment sensor AS is provided with a support structure for supporting the substrate and a movement mechanism operable to move the support structure relative to the Illumination source 220. All movements shown are parallel to the X axis. Similar actions apply for scanning the alignment mark 204 with spot 208 in the Y direction.

Figure 6:
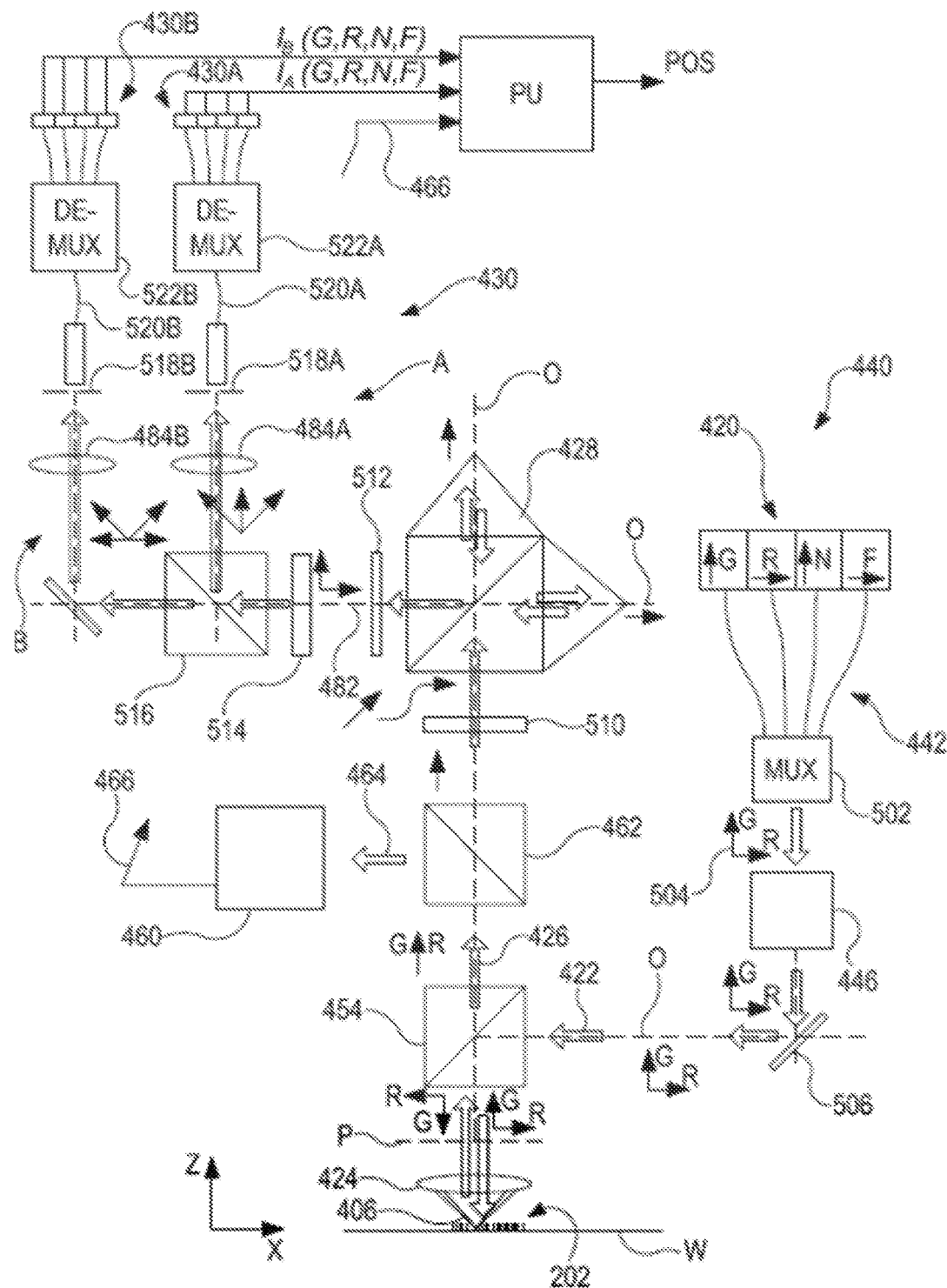
FIG. 6 is a schematic diagram of a second overlay apparatus further showing features of multiple wavelengths and polarization.

FIG. 6 illustrates an optical system of an alignment sensor that is a modified version of one described in the prior publications U.S. Pat. No. 6,961,116 and US 2009/195768 mentioned above. The overlay measurement system according to an embodiment of the invention may be generally of the form of this modified arrangement as shown in FIG. 6 and now described. The arrangement of FIG. 6 introduces the option of off-axis illumination modes which, among other things, allows a reduced pitch of an alignment mark for greater accuracy. The optical system may also allow scatterometry type measurements to be performed with the alignment sensor, rather than with a separate scatterometer apparatus. In FIG. 6, for simplicity the details of providing off-axis and on-axis modes of illumination are omitted. For the present disclosure it is more interesting to show details of the multiple wavelengths and polarizations.

An optical axis O which has several branches is indicated by a broken line running throughout the optical system shown in FIG. 6. For ease of comparison with the schematic diagram of FIG. 5, some parts of the optical system shown in FIG. 6 are labelled with reference signs similar to those used in FIG. 5, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below.

Additional components illustrated in this more detailed schematic diagram are as follows. In an illumination subsystem 440, radiation from source 420 is delivered via optical fibres 442 to an illumination profiling optics 446. This delivers input beam 422 via beam splitter 454 to objective lens 424 having a pupil plane P. Objective lens 424 forms a spot 406 on a mark 202/204/210 (for example an alignment mark or a pair of overlapping overlay marks) on the wafer W. Information-carrying beam 426, diffracted by the alignment mark, passes through beam splitter 454 to interferometer 428. Interferometer 428 splits the information carrying beam into two parts with orthogonal polarization, rotates these parts about the optical axis by 180° relative to one another, and combines them into an outgoing beam 482. The outgoing beam 482 enters the detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, US 20125227061, which is hereby incorporated in its entirety by reference, describes techniques for the measurement of asymmetry using position information obtained through the detector 430. It will be appreciated that the asymmetry measuring arrangement 460 is optional and may therefore be omitted in other embodiments.

Illumination profiling optics 446 can take various forms, some of which are disclosed in more detail in prior patent application US 2015109624, which is hereby incorporated in its entirety by reference. In the examples disclosed therein, alignment sensors (more generally, position measuring apparatuses) are shown which allow the use of reduced grating pitches without the need for spatial resolution on the detector side. A particular feature common to the examples described in the prior application US 2015109624, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the mark from substantially $\lambda/NA$ to substantially $\lambda/2NA$, where $\lambda$ is the wavelength of radiation used, and NA is the numerical aperture of an objective lens of the instrument (e.g. the alignment sensor or more generally the position measuring apparatus). The examples described in the prior application US 2015109624, also use a particular distribution of spot mirrors in a beam splitter of the apparatus, which can both provide the desired illumination and act as a field stop for zero order diffracted radiation. A 'universal' illumination profile can be designed that allows for measuring any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

The apparatus as a whole need not be limited to providing these particular off-axis illumination profiles. It may have other modes of use, both known or yet to be developed, which favour the use of different profiles. For example, the apparatus may provide for selection of on- and off-axis illumination modes for the different mark types shown in FIGS. 4(*a*) and 4(*b*). While off-axis illumination is of interest for use with finer gratings, an on-axis illumination profile may be useful for compatibility with existing marks and measurement methods. Referring firstly to the example of an on-axis mode, as used in the known sensor of FIG. 5, illumination normal to the substrate is provided by an on-axis illumination profile having a central bright spot within an otherwise dark pupil. This profile is an optional setting in the illumination beam 422 of the apparatus. In this example, it is desired for the zero order beam which returns along the optical axis to be blocked before entry into the interferometer 428, but also for it to be transferred to the asymmetry measuring arrangement 460 (when provided). To block the zero order before the interferometer 428 is not essential, but improves the signal to noise ratio of the position signal. Accordingly, in this embodiment, a spot mirror may be included in the second beam splitter 462. The first splitter 454 is not silvered, and one accepts that approximately 50% of the intensity of the central spot is transferred to the alignment mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, various alternative solutions are provided in the prior application US 2015109624, mentioned above.

The illumination emerging from the illumination source 442 may be monochromatic but is typically broadband in nature, for example white light, or polychromatic. It will be appreciated that the illumination source 442 is a source operable to emit electromagnetic radiation. This radiation may comprise visible light and/or electromagnetic radiation outside of the visible spectrum, for example infrared radiation. It will be appreciated that in the following the term "radiation" is synonymous with the term "light" and may be used interchangeably. Similarly, a wavelength (or range of wavelengths) of such radiation may be referred to as the "colour" of the radiation whether the radiation is from the visible spectrum or not. A diversity of wavelengths in the beam increases the robustness of the measurement, as is known. One known sensor uses for example a set of four wavelengths, each of the four wavelengths being in the range 500 nm to 900 nm. These four wavelengths may be referred to by the name of their colours, which may be: green (comprising green light), red (comprising red light), near infrared (comprising radiation in the near infrared) and far infrared (comprising radiation in the far infrared). In a sensor implementing the present invention, the same four wavelengths could be used, or a different four, or more or fewer than four wavelengths may be used.

Referring to FIG. 6 again, aspects of the apparatus concerned with measurement using multiple wavelengths of radiation, and concerned with the management of polarization effects, will now be explained. In the illumination subsystem 440, the source 420 comprises four individual light sources that are provided to produce radiation of four wavelengths named green (labelled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The light sources are linearly polarized, with the G and N radiation being oriented the same as one another, and the R and F radiation being polarized orthogonally to the polarization of the G and N radiation.

The four colours are transported by polarization maintaining fibres to a multiplexer 502, where they are combined into a single four-colour beam. The multiplexer maintains linear polarization, as indicated by arrows 504. The arrows 504 and similar arrows throughout the diagram are labelled G and R to indicate polarization of the green and red components. The N and F components are oriented the same as the G and R components, respectively.

This combined beam goes via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by mark 202 on the wafer W. Light is collected by objective lens 424, with for example a numerical aperture NA=0.6. This NA value allows at least ten orders of diffraction to be collected from a grating with, for example, a 16 μm pitch, for each of the colours.

The reflected and diffracted light forming information carrying beam 426 is then transported to the self-referencing interferometer 428. In this example, as already described, the beam is split by beam splitter 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one colour, for clarity. The interferometer, as already described above and in the U.S. Pat. No. 6,961,116, consists of a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each colour, the corresponding difference signal ends up in the other path. It will be appreciated that a radiation source is a source operable to emit radiation, for example electromagnetic radiation. The radiation may comprise visible light. Alternatively, the radiation may comprise electromagnetic radiation outside of the visible spectrum, for example infrared radiation. It will be appreciated that in the above description the term "radiation" is synonymous with the term "light". Any reference to light may therefore encompass electromagnetic radiation outside of the visible spectrum.

Note that this arrangement chooses to use one polarization for illumination in each colour. Measurements with two polarizations per colour could be made, by changing the polarization between readings (or by time division multiplexing within a reading). However, to maintain high throughput while benefiting from some diversity in colour and polarization, a set of different colours, each colour being linearly polarized and with one subset of the colours having one polarization direction and another subset of the colours having a different polarization direction, represents a good compromise between diversity and measurement throughput. To increase diversity without impacting throughput, one can envisage an implementation similar to the four-colour scheme presented here, but using more colours, for example eight or sixteen, with mixed polarizations.

The light for each path A and B is collected by a respective collector lens assembly 484A and 484B. It then goes through an aperture 518A or 518B that eliminates most of the light from outside the spot on the substrate. Two multimode fibres 520A and 520B transport the collected light of each path to respective demultiplexers 522A and 522B. The demultiplexers 522A, 522B split each path in the original four colours, so that a total of eight optical signals are delivered to detectors 430A and 430B within detector arrangement 430. In one practical embodiment, fibres are arranged between the demultiplexers and eight detector elements on a detector circuit board. The detectors in this example provide no spatial resolution, but deliver time-varying intensity signals $I_A$ and $I_B$ for each colour, as the apparatus scans the mark 202 on substrate W. The signals are actually position-dependent signals, but received as time-varying signals (waveforms) synchronized with the physical scanning movement between the apparatus and the mark (recall FIG. 5).

In the known alignment sensor, processing unit PU receives the intensity waveforms from the eight detectors and processes these as in the known apparatus to provide a position measurement POS. In the overlay measurement system according to an embodiment of the invention the analysis of the measured signal allows an overlay to be determined (again, as described further below, with reference to FIGS. 7A to 8).

Because there are eight signals to choose from, based on different wavelengths and incident polarizations, the apparatus can obtain useable measurements in a wide variety of situations. In this regard it should be remembered that the mark 202 may be buried under a number of layers of different materials and structures. Some wavelengths will penetrate different materials and structures better than others. The processing unit PU may process the waveforms and provide a measurement based on the one which is providing the strongest signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003), which is hereby incorporated in its entirety by reference.

Each lens 484A, 484B focuses the entire field onto each element of each detector 430A, 430B, which is an arrangement similar to the known alignment sensor of FIG. 5. The detectors in this example and in the known alignment sensor are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment sensor hardware.

The mark may be scanned more than once if it is desired for example to perform a measurement using two different polarizations. Also it may be desirable to switch the illumination mode midway through scanning the XY mark. In other embodiments, however, multiplexing of optical signals may be used so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division de-multiplexing could also be used, but this may require accurate synchronization between source and detector. De-multiplexing can also be achieved by using sufficiently long fibres to exploit a wavelength dependent velocity. The modulation at each frequency can be a simple sine or square wave, for example.

If it is desired to illuminate a mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the mark). The spot positions are chosen as before according to the mark orientation. The direction of circular polarization (clockwise/counter clockwise) can be changed by selecting a different linear polarization in the illumination source 420, optical fibres 442 or illumination profiling optics 446.

Also described in the paper by Huijbregtse et al is the use of multiple gratings in a composite target. Each grating has a different profile, enhancing for example higher diffraction orders ($3^{rd}$, $5^{th}$, $7^{th}$). Position measurements can be derived from different ones of these gratings, as well as from different colour signals on an individual grating. In the present disclosure, it is assumed that there is a single grating with a simple bar pattern, but having segmented features. The skilled reader can readily expand the disclosure to envisage embodiments having multiple gratings with different patterns.

Embodiments of the present invention relate to a method for determining an overlay between two features provided on or in an object. The object may, for example, be a substrate W (for example a silicon wafer) substantially as described above and the two features may be marks 14, 16. The marks 14, 16 may be provided in two different process layers of the substrate W and may each comprise one or more reflective grating.

The method comprises irradiating the substrate W with a radiation beam $B_{in}$ and receiving at least a portion of the radiation beam scattered from the substrate W. In particular, the at least a portion of the radiation beam that is scattered from the substrate may comprises: a first portion comprising at least one diffraction order ($B_{+1}$) and a second portion comprising at least one different diffraction order ($B_{-1}$). The two diffraction beams may be conjugate diffraction orders. The first and second portions are combined such that they interfere and an intensity of the combined first and second portions is determined.

The method involves moderating a phase difference between the first and second portions (for example $B_{+1}$ and $B_{-1}$) before they are combined such that the intensity of the combined first and second portions is time dependent while monitoring said intensity.

These steps of the method for determining an overlay between two features provided on an object according to an embodiment of the present invention may be performed using an overlay measurement system according to an embodiment of the invention. As explained above with reference to FIGS. 5 and 6, the overlay measurement system according to an embodiment of the invention may be generally of the form of a diffraction based alignment sensor, such as one of the alignment sensors of FIGS. 5 and 6. Such diffraction based alignment sensors include the following sensors available from ASML Holding N.V. of Veldhoven, the Netherlands: the SMASH™ (SMart Alignment Sensor Hybrid) sensor, the ATHENA™ (Advanced Technology using High order ENhancement of Alignment) sensor and the ORION™ sensor. Such diffraction based alignment sensors also include the LIA (laser interferometric alignment) or FIA (field image alignment) sensors.

The moderation of the phase difference between the first and second portions (for example $B_{+1}$ and $B_{-1}$) before they are combined may be achieved by moving the substrate W relative to the radiation beam such that the radiation beam scans across the object. Note that such scanning techniques are employed by the alignment sensors shown in FIGS. 5 and 6. The time-varying intensity signals $I_A$ and $I_B$ for each colour that are determined by the detectors 430A and 430B shown in FIG. 6 as the apparatus scans the mark 202 on substrate W are the result of the combination of first and second portions of radiation scattered from mark 202 on substrate W whilst a phase difference between the first and second portions is modulated before they are combined.

It will be appreciated that such scanning techniques are merely one example and that in alternative embodiments moderation of the phase difference between the first and second portions before they are combined may be achieved using a suitable adjustable optical element such as, for example, a retarder.

The method of determining an overlay between the two features 14, 16 involves determining the overlay between the two features 14, 16 in dependence on a contrast of the time dependent intensity of the combined first and second portions (for example the contrast of signals $I_A$ and $I_B$).

As previously discussed, prior art overlay measurement techniques that involve diffraction typically involve the separate determination of the intensities of the two conjugate diffraction beams which are subsequently compared to determine the overlay.

The method of the first aspect of the invention also works on the principle that an overlay between two gratings results in an asymmetry of the combined gratings, which results in a difference in the intensity of pairs of conjugate diffraction beams. By combining the first and second portions of the radiation beam that have scattered from the object (and which contain at least one pair of different diffraction orders) the pair of different diffractions orders (which may be conjugate diffraction orders) can interfere (either constructively or destructively). Moderating a phase difference between the first and second portions before they are combined causes the nature of this interference to vary with time such that the intensity of the combined first and second portions is time dependent. A plot of a graph of this intensity as a function of time may be referred to as an interferogram. The inventor of the present invention has realized that the contrast of such an interferogram is dependent on the difference in the intensity of pairs of different diffraction beams. When the difference is zero, which may, for example, correspond to zero overlay, the contrast of the interferogram is maximized. Furthermore, as the difference increases the contrast of the interferogram decreases.

Therefore the contrast of the time varying intensity of the combined first and second portions is dependent on the relative intensities of pairs of different diffraction beams (which may be conjugate diffraction beams) which, in turn, is dependent on the overlay in a predictable way, as now discussed.

As explained above, embodiments of the invention involve the combination of first and second portions of radiation scattered from the substrate W, the first and second portions containing at least one pair of different diffraction orders (for example, $B_{+1}$ and $B_{-1}$). For example, the first and second portions may contain at least one pair of conjugate diffraction orders (for example, $B_{+1}$ and $B_{-1}$). In general, embodiments of the invention may involve the combination of any pair of conjugate diffraction orders (for example, $B_{+1}$ and $B_{-1}$, $B_{+2}$ and $B_{-2}$ and so on). Some embodiments may involve the combination of more than one pair of diffraction orders (for example multiple pairs of conjugate diffraction orders). Furthermore, in some embodiments the substrate W may be irradiated by the radiation beam $B_{in}$ with off-axis illumination. Such embodiments, may involve the combination of any number of pairs of different diffraction orders that are not necessarily conjugate. In general, embodiments may involve the combination of any of the following: pairs of conjugate diffraction orders; pairs of positive diffraction orders (for example, $B_{+1}$ and $B_{+2}$ and so on); pairs of negative diffraction orders (for example, $B_{-1}$ and $B_{-2}$ and so on); pairs of positive and negative diffraction orders that are not conjugate (for example, $B_{+1}$ and $B_{-2}$ and so on); and/or a $0^{th}$ order diffraction beam with a positive or negative order diffraction beam (for example, $B_0$ and $B_{+1}$ and so on). How the contrast of the time varying intensity of the combined first and second portions is dependent on the relative intensities of the conjugate diffraction beams is now discussed by way of example with reference the conjugate diffraction orders $B_{+1}$ and $B_{-1}$ shown in FIG. 3. It will be apparent to the skilled person how this may be extended and applied to other pairs of conjugate diffraction orders and other pairs of diffraction orders that are not conjugate.

Referring to FIG. 3, the electric field of the +1st order diffraction beam 20 may be represented by $Ae^{j\alpha}$, where A is an amplitude diffraction efficiency, $\alpha$ is a phase and j is the square root of −1. Similarly, the −1st order diffraction beam 22 may be represented by $Ae^{-j\alpha}$. The electric field of the +1st order diffraction beam 24 may be represented by $Be^{j\beta}$, where B is an amplitude diffraction efficiency and $\beta$ is a phase. Similarly, the −1st order diffraction beam 26 may be represented by $Be^{j\beta}$. The phase $\beta$ may be considered to be dependent on the thickness 28 of the second process layer 12 whereas the phase $\alpha$ may be considered to be dependent on the overlay or shift between the two marks 14, 16. For example, the phase 3 may be proportional to the ratio of the thickness 28 of the second process layer 12 to a wavelength of the radiation beam $B_{in}$. The phase $\alpha$ may be considered to be proportional to a ratio of the overlay or shift between the two marks 14, 16 (i.e. a shift of the second mark 16 relative to the first mark 14), to the grating pitch.

The intensity of the +1st order diffraction beam $B_{+1}$ is given by:

$$I_1 = |Ae^{j\alpha} + Be^{j\beta}| = A^2 + B^2 + 2AB \cos[\beta - \alpha], \quad (1)$$

and the intensity of the −1st order diffraction beam $B_{-1}$ is given by:

$$I_{-1} = |Ae^{-j\alpha} + Be^{j\beta}| = A^2 + B^2 + 2AB \cos[\beta + \alpha]. \quad (2)$$

Equations (1) and (2) can be rewritten more concisely as:

$$I_1 = P + Q \cos[\beta - \alpha], \quad (3)$$

and $$I_{-1} = P + Q \cos[\beta + \alpha], \quad (4)$$

where $P = A^2 + B^2$ and $Q = 2AB$.

The contrast of the above described time varying intensity signal (which is obtained by combining, for example, the ±1st order diffraction beams $B_{+1}$, $B_{-1}$) is given by:

$$C = \frac{I_{MAX} - I_{MIN}}{I_{MAX} + I_{MIN}} = \frac{2\sqrt{I_1 I_{-1}}}{I_1 I_{-1}}. \quad (5)$$

A modulation depth M may be defined as:

$$M = \frac{Q}{P}. \quad (6)$$

This modulation depth M describes how strongly the ±1st order intensities ($I_1$, $I_{-1}$) vary as a function of the overlay or shift between the two marks 14, 16 (i.e. a shift of the second mark 16 relative to the first mark 14).

Substituting equations (3) and (4) into equation (5), and re-expressing in terms of the modulation depth M gives:

$$C = \frac{\sqrt{1 + 2M \cos(\beta)\cos(\alpha) + 0.5M^2[\cos(2\beta) + \cos(2\alpha)]}}{1 + M \cos(\beta)\cos(\alpha)}. \quad (7)$$

Figure 8:
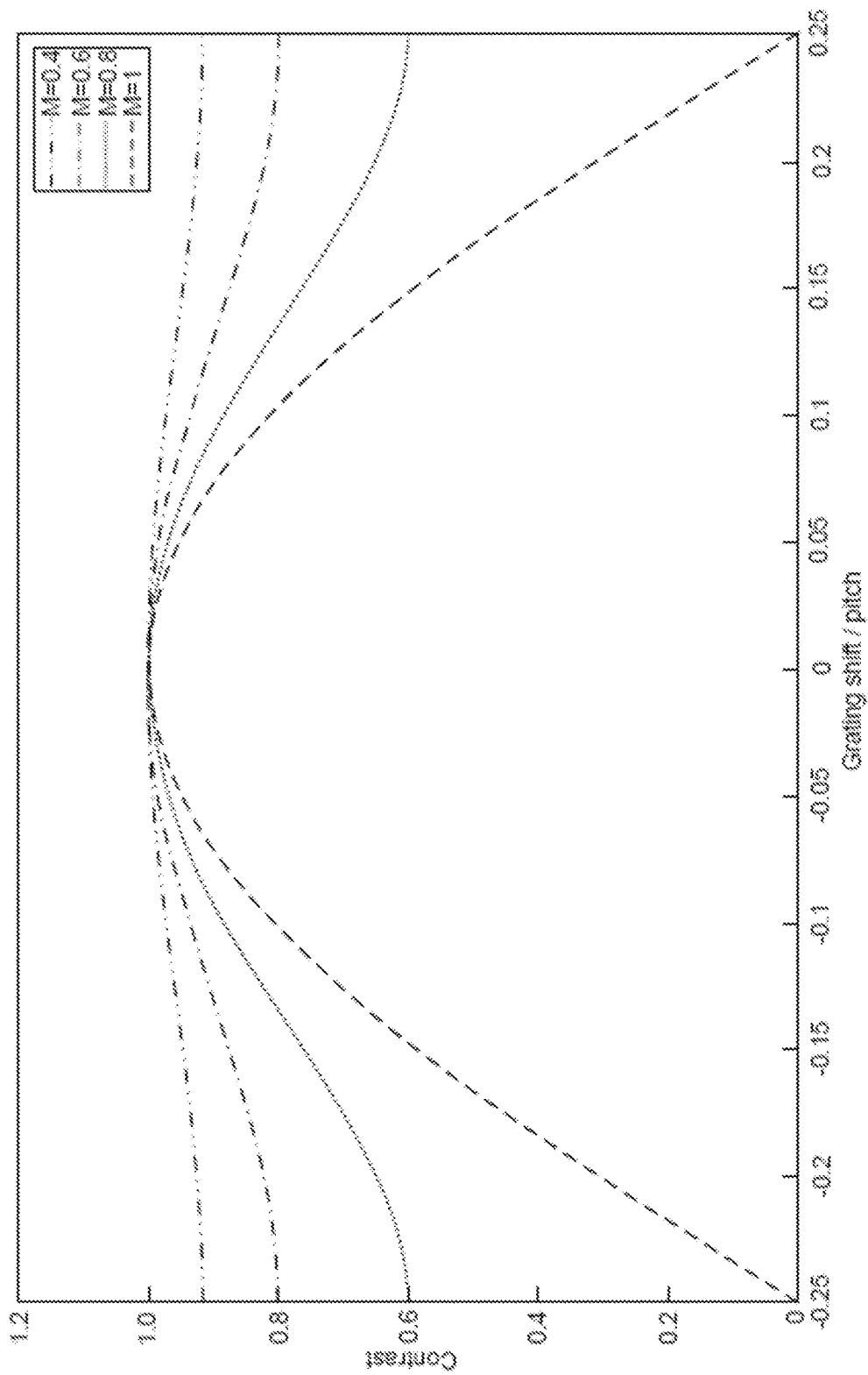
FIG. 8 is a graph showing a calculated contrast of an interferogram signal as a function of the shift of an upper feature relative to a lower feature (normalized to the grating pitch).

FIG. 8 shows the calculated contrast (as given by equations (5) and (7)) of the time varying intensity signal as a function of the shift of the top grating (for example second mark 16 in FIG. 3) relative to the bottom grating (for example first mark 14 in FIG. 3), normalized to the grating pitch (i.e. as a function of a parameter which is proportional to the phase α). This graph has been calculated for β=90° (which can be achieved by selecting a suitable wavelength) and curves are plotted for 4 different values of the modulation depth: M=0.4 (dot-dot-dash line), M=0.6 (dot-dash line), M=0.8 (dotted line) and M=1 (dashed line).

The method according to an embodiment of the invention is advantageous because it provides a significantly better dynamic range than prior art arrangements. This increase in dynamic range is the result of determining of the contrast of a modulated intensity signal, in contrast to prior art arrangements which, for example, involve separately measuring the intensities of conjugate diffraction orders and comparing these. In particular, this allows weak intensity signals to be separated from dominant background signals, such as ghosts and camera noise. This is due in part to an increased number of photons being detected. It is also due to the interferometric technique, which produces a modulated signal (for example the time varying signals $I_A$ and $I_B$) that results in the measurement being resilient against background and/or noise. Therefore, the method allows a greater range of overlays to be measured.

Another advantage of the method is that it shares some common processes with some alignment measurement methods. In particular, a benefit of the overlay measurement method of the first aspect of the invention is that substantially the same apparatus (for example the alignment sensors shown in FIGS. 5 and 6) can be used for this overlay measurement and for alignment measurement. Furthermore, advantageously, the apparatus for performing the method may comprise a relatively simple sensor arrangement in comparison with the overlay apparatus used for prior art techniques.

A specific example of a method which uses the contrast of the time dependent intensity of the combined first and second portions (for example the contrast of signals $I_A$ and $I_B$) to determine an overlay between the two features 14, 16 is now discussed with reference to FIGS. 7A to 7C.

The method uses two marks 14, 16 each of which comprises a plurality of sub-features. Each of the sub-features of a first one of the two features corresponds to a different one of the sub-features of a second one of the two features. By this it is meant that each of the sub-features of one feature (for example the second mark 16) is generally aligned with or generally overlays a corresponding sub-feature of the other feature (for example the first mark 14) such that the above-described techniques may be used to determine an overlay shift or error for each pair of corresponding sub-features from the coherent scattering of a radiation beam $B_{in}$ from the pair of corresponding sub-features. Each pair of corresponding sub-features has a different nominal offset, as now explained, with reference to FIG. 7A.

Figure 7A:
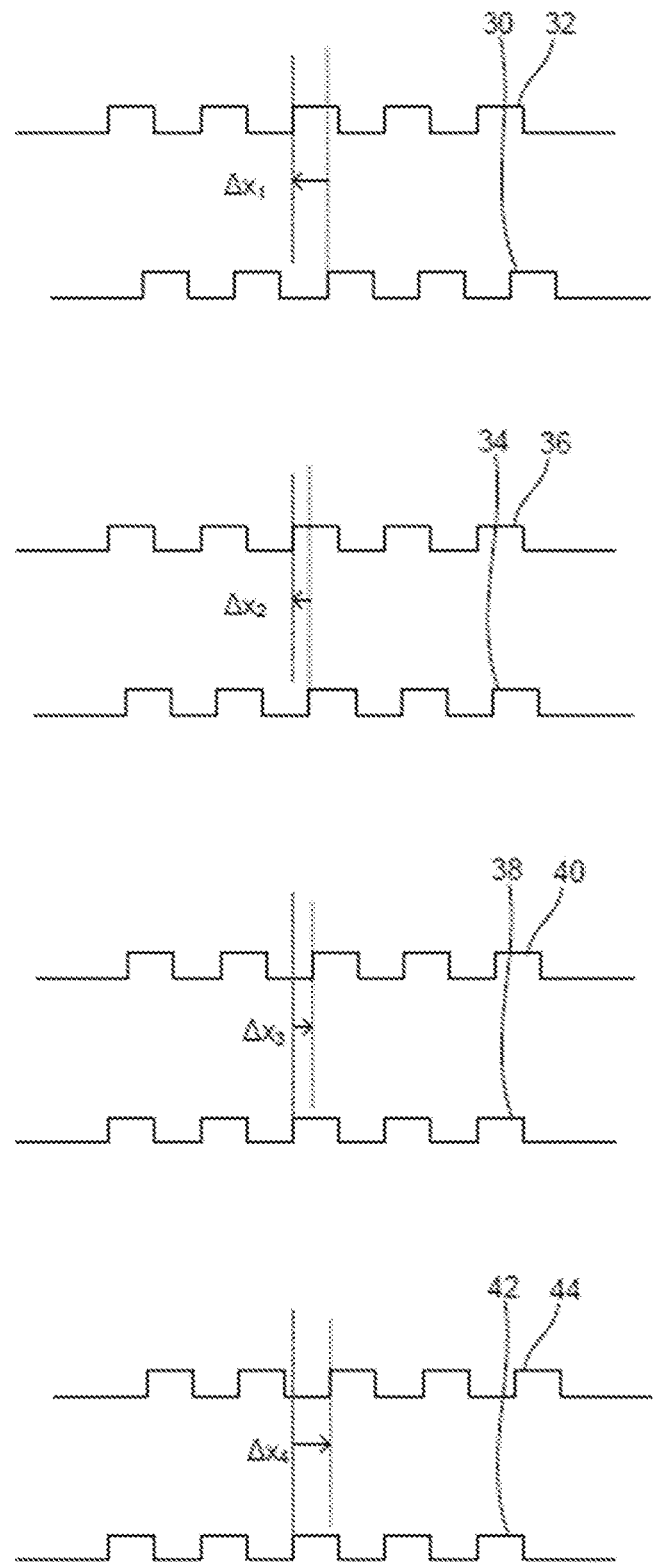
FIG. 7A is a schematic representation of two overlay features provided in different layers of an object, each of the overlay features comprising four sub-features, each of the sub-features of a first one of the two features corresponding to a different one of the sub-features of a second one of the two features, each pair of corresponding sub-features having a different nominal offset $\Delta X_n$.

FIG. 7A is a schematic representation of four pairs of corresponding sub-features 30, 32; 34, 36; 38, 40; 42, 44 provided on an object (for example a substrate W). Each pair of corresponding sub-features 30, 32; 34, 36; 38, 40; 42, 44 comprises a first sub-feature 30, 34, 38, 42 formed in a first process layer 10 and a second sub-feature 32, 36, 40, 44 formed in a second process layer 12. Each of the second sub-features 32, 36, 40, 44 formed in a second process layer 12 is generally above or overlays a corresponding one of the first sub-feature 30, 34, 38, 42 formed in a first process layer 10. Together the first sub-features 30, 34, 38, 42 may be considered to form a first mark 14. Similarly, together the second sub-features 32, 36, 40, 44 may be considered to form a second mark 16. For example, the four pairs of corresponding sub-features 30, 32; 34, 36; 38, 40; 42, 44 may be arranged along a line such that they can be sequentially irradiated by radiation beam $B_{in}$ in a single scanning process. The marks may also be used for alignment of the substrate with respect to a reference.

Each of the sub-features 30, 32, 34, 36, 38, 40, 42, 44 comprises a grating having substantially the same pitch and being formed from a plurality of square profile grooves, the width of each groove being substantially the same as the separation between adjacent grooves. It will be appreciated that this square profile grating shape is used as a single example merely to explain the method and that in other embodiments other grating shapes may alternatively be used. For example, in other embodiments each of the sub-features 30, 32, 34, 36, 38, 40, 42, 44 may comprise sub-segmented gratings, trapezoid gratings or any other convenient grating shape as desired.

Each pair of corresponding sub-features 30, 32; 34, 36; 38, 40; 42, 44 have a different nominal offset $\Delta X_1$, $\Delta X_2$, $\Delta X_3$, $\Delta X_4$. It will be appreciated that the nominal offset of a corresponding pair of sub-features is intended to mean an offset between the corresponding pair of sub-features that was intended to be provided when the sub-features were applied to the object (for example in a lithographic apparatus). That is, it is intended to mean the offset between the corresponding pair of sub-features that would be achieved in the absence of overlays.

An embodiment of the method for determining an overlay comprises successively irradiating each pair of sub-features with the radiation beam, determining a contrast of the time dependent intensity of the combined first and second portions; and determining the overlay between the two features from each of the plurality of determined contrasts.

This arrangement may improve the accuracy of the method since a plurality of measurements (of the determined contrasts) contributes to the overlay measurement.

In principle, in order to determine the overlay from four determined contrasts from the four pairs of sub-features, various parameters should be taken into account, for example: the form of the pair of sub-features (i.e. their shapes), the depth between the two sub-features (i.e. the distance between the two different process layers on which they are provided) and the scattering efficiencies of the two features. By using a plurality of pairs of corresponding sub-features, each pair having a different (and known) nominal offset, different contrasts will be measured. However, for each corresponding pair of sub-features all of the other parameters that may affect the determined contrasts (for example: the form of the pair of sub-features, the depth between the two sub-features and the scattering efficiencies of the two features) are the same. Therefore, by combining the determined contrasts from the plurality of pairs of corresponding sub-features the dependence of the determined overlay on these other parameters may be removed.

FIG. 7B is a schematic representation of an interferogram for each pair of corresponding sub-features shown in FIG. 7A formed by scanning a radiation beam over the pair of corresponding sub-features. The interferograms are graphs of the intensity of the combination of at least one pair of conjugate diffraction orders scattered from the pair of corresponding sub-features as a function of scanning position. In particular, a first interferogram shows a curve 46 representing a measured intensity signal (solid line) and a curve 48 representing the expected curve with zero overlay (dotted line) for the first pair of sub-features 34, 36. A second interferogram shows a curve 50 representing a measured intensity signal (solid line) and a curve 52 representing the expected curve with zero overlay (dotted line) for the second pair of sub-features 38, 40. A third interferogram shows a curve 54 representing a measured intensity signal (solid line) and a curve 56 representing the expected curve with zero overlay (dotted line) for the third pair of sub-features 38, 40 (the two curves 54, 56 of the third interferogram are not visibly distinguishable in FIG. 7B). A fourth interferogram shows a curve 58 representing a measured intensity signal (solid line) and a curve 60 representing the expected curve with zero overlay (dotted line) for the fourth pair of sub-features 42, 44. It will be appreciated that here, in connection with FIGS. 7B and 7C "zero overlay" is intended to mean that the overlay is zero such that the actual offset between the pair of corresponding sub-features is equal to the nominal offset for that pair of corresponding sub-features.

A contrast of the time dependent intensity of the combined first and second portions can be determined for each pair of corresponding sub-features 30, 32; 34, 36; 38, 40; 42, 44 from the corresponding interferogram curve 46, 50, 54, 58 respectively. The contrast is defined as the ratio of the amplitude of an alternating current signal AC to the amplitude of a direct current signal DC.

As now described with reference to FIG. 7C, determining the overlay difference between the two marks 14, 16 from the determined contrasts may involve fitting a parameterization to the determined contrast of each of the pairs of corresponding sub-features 30, 32; 34, 36; 38, 40; 42, 44 as a function of the nominal offset of the sub-feature pair and comparing the fit to a nominal curve.

FIG. 7C is a plot of the measured contrast of each of the measured interferogram curves 46, 50, 54, 58 shown in FIG. 7B as a function of the nominal offset $\Delta X_1, \Delta X_2, \Delta X_3, \Delta X_4$ of the pair of corresponding sub-features 30, 32; 34, 36; 38, 40; 42, 44 from which it was formed.

For zero offset between a pair of sub-features the contrast is maximized. As the offset increases or decreases from zero the contrast will decrease. Therefore, with zero overlay, a curve of the contrast as a function of the nominal offset will have a maximum at zero nominal offset and will fall off as the magnitude of the nominal offset increases. Furthermore one would expect the curve to fall off symmetrically on either side of the maximum. For example, as explained above with reference to FIG. 8, the contrast as a function of nominal offset may be expected to be given by Equation (7) and may, for example, be substantially parabolic. In addition, the skilled reader will appreciate that a curve of the contrast as a function of nominal offset will periodically repeat with a period equal to the grating pitch divided by 2. For a situation with a non-zero overlay, a curve of the contrast as a function of nominal offset will be shifted along the nominal offset axis by an amount equal (at least in magnitude) to the overlay, such that the maximum is located not at zero nominal offset but where the nominal offset is equal in magnitude to the overlay.

Therefore, in one embodiment a curve (of the general form of equation (6) but with some free parameters) is fitted to the determined contrast of each of the four pairs of corresponding sub-features 30, 32; 34, 36; 38, 40; 42, 44 as a function of the nominal offset $\Delta X_1, \Delta X_2, \Delta X_3, \Delta X_4$ of the pair of sub-features and the overlay is determined from the position of the maximum of the curve.

Also shown in FIG. 7C is a curve 62 (solid line) which represents a function which has been fitted to the four measured data points (for example using a least squares fitting algorithm) and a nominal curve 64 (dotted line) that would be expected for zero overlay. The overlay can be determined as the shift 66 between the fitted curve 62 and the nominal curve 64. It will be appreciated that this offset may be determined directly from the measured curve 62, for example by determining the position of the maximum of measured curve 62, i.e. a value of grating shift for which the curve 62 is maximal. The magnitude of the overlay is given by the shift 66 between the fitted curve 62 and the nominal curve 64.

It will be appreciated that for methods according to embodiments of the present invention, it is desirable that the contrast variation as a function of grating shift be relatively large. The greater the contrast variation as a function of grating shift, the better the sensitivity of the method and, therefore, the better accuracy with which an overlay can be determined. Furthermore, it will be appreciated from equation (6) and FIG. 8 that in order for the contrast variation as a function of grating shift to be high, it is desirable for the amplitude diffraction efficiencies A, B to be approximately equal. For two marks 14, 16 which are substantially identical, one may expect the amplitude diffraction efficiency B from the first mark 14 to be smaller than the amplitude diffraction efficiency A from the second mark 16. However, it will be appreciated that, in order to increase the contrast variation as a function of grating shift, the shape of one or both of the two marks 14, 16 may be controlled so as to ensure that the amplitude diffraction efficiencies A, B are approximately equal.

It will be appreciated that any reference to a mark may be any form of diffraction grating. In particular, it may include any known type of alignment mark or any known type of overlay mark as desired or appropriate.

It will be appreciated that a radiation source is a source operable to emit radiation, for example electromagnetic radiation. The radiation may comprise visible light. Therefore, it will be appreciated that the term "radiation" may be synonymous with the term "light".

Although specific reference may be made in this text to embodiments of the invention in the context of a lithographic apparatus, embodiments of the invention may be used in other apparatus. An apparatus according to embodiments of the present invention may, for example, be used for medical applications, for example as part of a metrology system within a medical device. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which may control an overlay measurement system according to an embodiment of the invention, processes signals detected by it, and calculates from these signals overlay measurements, will typically involve a computer assembly of some kind, which will not be described in detail. The computer assembly may be arranged for loading a computer program product comprising computer executable code. This may enable the computer assembly, when the computer program product is downloaded, to control aforementioned uses of an overlay measurement system according to an embodiment of the invention.

Further embodiments according to the invention are described in below numbered clauses:

1. A method of determining a parameter of a patterning process applied to an object comprising two features, the method comprising:
    irradiating the two features of the object with a radiation beam;
    receiving at least a portion of the radiation beam scattered from the two features of the object, the at least a portion of the radiation beam comprising: a first portion comprising at least one diffraction order and a second portion comprising at least one diffraction order that is different to a diffraction order of the first portion;
    moderating a phase difference between the first and second portions;
    combining the first and second portions such that they interfere to produce a time dependent intensity signal; and
    determining the parameter of the patterning process from a contrast of the time dependent intensity signal.

2. The method of clause 1 wherein each of the two features comprises a plurality of sub-features,
    wherein the step of irradiating the two features of the object with a radiation beam comprises sequentially irradiating: each sub-feature of a first one of the features and a corresponding sub-feature of the second one of the features with the radiation beam;
    wherein for each such pair of corresponding sub-features, the first and second portions are combined such that they interfere to produce a time dependent intensity signal; and
    wherein the step of determining the parameter of the patterning process comprises determining the parameter of the patterning process from a contrast of each such time dependent intensity signal.

3. The method of clause 2 wherein each pair of corresponding sub-features has a different nominal offset.

4. The method of clause 2 or clause 3 wherein determining the parameter of the patterning process from the contrast of each time dependent intensity signal involves fitting a parameterization to the contrast for each pair of corresponding sub-features of the first and second features as a function of the nominal offset of the pair of corresponding sub-features and comparing the fit to a nominal curve.

5. The method of any preceding clause wherein the first portion and the second portion are each formed from the interference between a portion of radiation scattered from a first of the two features and a portion of radiation scattered from a second of the two features.

6. A method of determining a parameter of a patterning process applied to an object comprising two features, the method comprising:
    irradiating the object with a radiation beam;
    receiving at least a portion of the radiation beam scattered from the object, the at least a portion of the radiation beam comprising: a first portion comprising at least one diffraction order and a second portion comprising at least one diffraction order that is different to a diffraction order of the first portion; wherein the first portion and the second portion are each formed from the interference between a portion of radiation scattered from a first of the two features of the object and a portion of radiation scattered from a second of the two features of the object;
    moderating a phase difference between the first and second portions;
    combining the first and second portions such that they interfere to produce a time dependent intensity signal; and
    determining the parameter of the patterning process applied to the object from the time dependent intensity signal.

7. The method of clause 6 wherein each of the two features comprises a plurality of sub-features,
    wherein the step of irradiating the object with a radiation beam comprises sequentially irradiating: each sub-feature of a first one of the features and a corresponding sub-feature of the second one of the features with the radiation beam;
    wherein for each such pair of corresponding sub-features, the first and second portions are combined such that they interfere to produce a time dependent intensity signal; and
    wherein the step of determining the parameter of the patterning process applied to the object comprises determining the parameter between the two features from a contrast of each such time dependent intensity signal.

8. The method of clause 7 wherein each pair of corresponding sub-features has a different nominal offset.

9. The method of clause 7 or clause 8 wherein determining the parameter of patterning process from the contrast of the time dependent intensity signals involves fitting a parameterization to a determined contrast for each pair of corresponding sub-features of the first and second features as a function of the nominal offset of the pair of corresponding sub-features and comparing the fit to a nominal curve.

10. The method of any preceding clause wherein moderating the phase difference between the first and second portions is achieved by moving the object relative to the radiation beam such that the radiation beam scans across the object.

11. The method may of any preceding clause further comprise forming an interferogram from which the or each contrast is determined.

12. The method of any preceding clause wherein the contrast of the time dependent intensity signal is defined as the ratio of the amplitude of an alternating current component of the signal to the amplitude of a direct current component of the signal.

13. The method of any preceding clause wherein the radiation beam comprises infrared radiation.

14. A method comprising:
    applying a first process layer to an object, the first process layer comprising a first feature;
    applying a second process layer to an object, the second process layer comprising a second feature; and
    determining a parameter of the patterning process of applying the first and second process layers to the object using the method of any preceding clause.

15. The method of clause 14 wherein:
    the first feature comprises a plurality of sub-features;
    the second feature comprises a plurality of sub-features, each corresponding to a different one of the sub-features of the first feature; and
    wherein each pair of corresponding sub-features is applied with a different nominal offset.

16. An apparatus for determining a parameter of a patterning process applied to an object comprising two features, the apparatus comprising:
  a radiation source operable to irradiate the object with a radiation beam;
  a measurement system operable to receive at least a portion of the radiation beam scattered from the object and further operable to determine the parameter of the patterning process therefrom, wherein the measurement system comprises: optics configured to combine a first portion and a second portion of the at least a portion of the measurement radiation beam scattered from the object; and a sensor configured to determine an intensity of the combined first and second portions; and
  a phase control mechanism operable to moderate a phase difference between the first and second portions before they are combined such that the intensity of the combined first and second portions is time dependent; and
  wherein the measurement system is operable to determine the parameter of the patterning process from a contrast of the time dependent intensity of the combined first and second portions.

17. The apparatus of clause 16 wherein the phase control mechanism comprises:
  a support structure for supporting an object; and
  a movement mechanism operable to move the support structure relative to the radiation source.

18. The apparatus of clause 17 wherein the movement mechanism is operable to move the support structure such that a plurality regions of the object are successively irradiated by the radiation beam and wherein the measurement system is operable to determine a contrast of the time dependent intensity of the combined first and second portions for each such region.

19. The apparatus of clause 16 wherein the measurement system is further operable fit a parameterization to the determined contrast for each region of the object as a function of a nominal offset of the region and to compare the fit to a nominal curve so as to determine the parameter of the patterning process.

20. The apparatus of any one of clauses 16 to 19 wherein the radiation beam comprises infrared radiation.

21. The apparatus of any one of clauses 16 to 20 that is configured to implement the method of any one of clauses 1 to 13.

22. An apparatus comprising:
  a radiation source operable to irradiate an object with a radiation beam;
  a phase control mechanism operable to moderate a phase difference between a first portion of the radiation scattered from the object and a second portion of the radiation scattered from the object; and
  a measurement system operable to receive at least a portion of the measurement radiation beam scattered from the object, wherein the measurement system comprises: optics configured to combine the first portion and the second portion of the at least a portion of the measurement radiation beam scattered from the object, the measurement system further operable to determine from a time dependent intensity of the combined first and second portions either: (a) a position a feature on the object relative to part of the apparatus or (b) a relative position of two features on the object.

23. The apparatus of clause 22, the measurement system further comprising a sensor configured to determine an intensity of the combined first and second portions.

24. The apparatus of clause 22 or clause 23 wherein the measurement system is operable to determine a relative position of two features on the object in dependence on a contrast of the time dependent intensity of the combined first and second portions.

25. The apparatus of any one of clauses 22 to 24 wherein the phase control mechanism comprises:
  a support structure for supporting an object; and
  a movement mechanism operable to move the support structure relative to the radiation source.

26. The apparatus of any one of clauses 22 to 25 wherein the radiation beam comprises infrared radiation.

27. The apparatus of any one of clauses 22 to 26 that is configured to implement the method of any one of clauses 1 to 13.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including infrared radiation (e.g. having a wavelength between 800 nm-2.5 µm), visible radiation (e.g. having a wavelength between 380 nm-800 nm), ultraviolet (UV) radiation (e.g. having a wavelength of 365, 248, 193, 157 or 126 nm) and extreme ultra-violet (EUV) radiation (e.g. having a wavelength in the range of 5-20 nm). In the context of exposure of a substrate, for example using the lithographic apparatus shown in FIG. 1A, the terms "radiation" and "beam" may include: ultra-violet (UV) radiation (e.g. having a wavelength of 365, 248, 193, 157 or 126 nm) and extreme ultra-violet (EUV) radiation (e.g. having a wavelength in the range of 5-20 nm) and particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of determining a parameter of a patterning process applied to an object comprising two features, the method comprising:
    irradiating the two features of the object with a radiation beam;
    receiving at least a portion of the radiation beam scattered from the two features of the object, the at least a portion of the radiation beam comprising a first portion comprising at least one diffraction order and a second portion comprising at least one diffraction order that is different from a diffraction order of the first portion;
    moderating a phase difference between the first and second portions;
    combining the first and second portions such that they interfere to produce a time dependent intensity signal; and
    determining the parameter of the patterning process from a contrast of the time dependent intensity signal.

2. The method of claim 1, wherein each of the two features comprises a plurality of sub-features,
    wherein the irradiating the two features of the object with a radiation beam comprises sequentially irradiating each sub-feature of a first one of the features and a corresponding sub-feature of the second one of the features with the radiation beam;
    wherein for each such pair of the corresponding sub-features, the first and second portions are combined such that they interfere to produce a time dependent intensity signal; and
    wherein the determining the parameter of the patterning process comprises determining the parameter of the patterning process from a contrast of each such time dependent intensity signal.

3. The method of claim 2, wherein each pair of the corresponding sub-features has a different nominal offset.

4. The method of claim 2, wherein the determining the parameter of the patterning process from the contrast of each time dependent intensity signal involves fitting a parameterization to the contrast for each pair of the corresponding sub-features of the first and second features as a function of the nominal offset of the pair of the corresponding sub-features and comparing the fit to a nominal curve.

5. The method of claim 1, wherein the first portion and the second portion are each formed from the interference between a portion of radiation scattered from a first of the two features and a portion of radiation scattered from a second of the two features.

6. An apparatus for determining a parameter of a patterning process applied to an object comprising two features, the apparatus comprising:
    a radiation source operable to irradiate the object with a radiation beam;
    a measurement system operable to receive at least a portion of the radiation beam scattered from the object and further operable to determine the parameter of the patterning process therefrom, wherein the measurement system comprises optics configured to combine a first portion and a second portion of the at least a portion of the measurement radiation beam scattered from the object and a sensor configured to determine an intensity of the combined first and second portions; and
    a phase control mechanism operable to moderate a phase difference between the first and second portions before they are combined such that the intensity of the combined first and second portions is time dependent;
    wherein the measurement system is operable to determine the parameter of the patterning process from a contrast of the time dependent intensity of the combined first and second portions.

7. The apparatus of claim 6, wherein the phase control mechanism comprises:
    a support structure configured to support an object; and
    a movement mechanism operable to move the support structure relative to the radiation source.

8. The apparatus of claim 7, wherein:
    the movement mechanism is operable to move the support structure such that a plurality regions of the object are successively irradiated by the radiation beam; and
    the measurement system is operable to determine a contrast of the time dependent intensity of the combined first and second portions for each such region.

9. The apparatus of claim 6, wherein the measurement system is further operable to fit a parameterization to the determined contrast for each region of the object as a function of a nominal offset of the region and to compare the fit to a nominal curve so as to determine the parameter of the patterning process.

10. The apparatus of claims 6, wherein the radiation beam comprises infrared radiation.

11. The apparatus of claim 6, that is configured to determine a parameter of a patterning process applied to an object comprising two features by:
    irradiating the two features of the object with a radiation beam;
    receiving at least a portion of the radiation beam scattered from the two features of the object, the at least a portion of the radiation beam comprising: a first portion comprising at least one diffraction order and a second portion comprising at least one diffraction order that is different from a diffraction order of the first portion;
    moderating a phase difference between the first and second portions;
    combining the first and second portions such that they interfere to produce a time dependent intensity signal; and
    determining the parameter of the patterning process from a contrast of the time dependent intensity signal.

* * * * *